(12) United States Patent  
Park

(10) Patent No.: US 11,948,521 B2
(45) Date of Patent: Apr. 2, 2024

(54) DISPLAY DEVICE AND IMAGE DISPLAY DEVICE COMPRISING SAME

(71) Applicant: LG ELECTRONICS INC., Seoul (KR)

(72) Inventor: Kyeongryeol Park, Seoul (KR)

(73) Assignee: LG ELECTRONICS, INC, Seoul (KR)

( * ) Notice: Subject to any disclaimer, the term of this patent is extended or adjusted under 35 U.S.C. 154(b) by 0 days.

(21) Appl. No.: 17/922,234

(22) PCT Filed: Apr. 28, 2020

(86) PCT No.: PCT/KR2020/005586
§ 371 (c)(1),
(2) Date: Oct. 28, 2022

(87) PCT Pub. No.: WO2021/221192
PCT Pub. Date: Nov. 4, 2021

(65) Prior Publication Data
US 2023/0178039 A1  Jun. 8, 2023

(51) Int. Cl.
*G09G 3/34* (2006.01)
*H01L 27/12* (2006.01)
*G09G 3/36* (2006.01)

(52) U.S. Cl.
CPC ....... *G09G 3/3406* (2013.01); *H01L 27/1214* (2013.01); *G09G 3/36* (2013.01); *G09G 2320/0233* (2013.01)

(58) Field of Classification Search
CPC .. G09G 3/3426; G09G 3/3648; G09G 3/3406; G09G 2320/0261; G09G 2354/00;
(Continued)

(56) References Cited

U.S. PATENT DOCUMENTS

2003/0206256 A1* 11/2003 Drain ................ G02F 1/133603
349/113
2007/0091059 A1* 4/2007 Kang ..................... G09G 3/342
345/102
(Continued)

FOREIGN PATENT DOCUMENTS

CN 108761888 11/2018
KR 100739735 7/2007
(Continued)

OTHER PUBLICATIONS

PCT International Application No. PCT/KR2020/005586, International Search Report dated Jan. 20, 2021, 4 pages.

*Primary Examiner* — Shaheda A Abdin
(74) *Attorney, Agent, or Firm* — LEE, HONG, DEGERMAN, KANG & WAIMEY

(57) ABSTRACT

The present disclosure relates to a display device and an image display apparatus including the same. A display device according to an embodiment of the present disclosure comprises a backlight, a first TFT panel, a second TFT panel, and a color filter wherein, while a first voltage is applied, a second voltage higher than the first voltage is applied in response to an object within an image frame data input to the display device; while a third voltage is applied, a fourth voltage higher than the third voltage is applied in response to the object within the image frame data input to the display device; and in response to movement of the object, a fifth voltage higher than the second voltage is applied, and a sixth voltage higher than the fourth voltage is applied. Accordingly, luminance expression power may be improved.

20 Claims, 21 Drawing Sheets

(58) Field of Classification Search
CPC ... G09G 2320/0238; G09G 2320/0252; G09G 2330/022; G09G 3/36; G09G 2320/0233; G09G 2300/023; G09G 2320/0646; H01L 27/1214; G02F 1/1335
See application file for complete search history.

(56) References Cited

U.S. PATENT DOCUMENTS

| | | | | |
|---|---|---|---|---|
| 2012/0285089 | A1* | 11/2012 | Artwohl | A47F 3/0434 49/70 |
| 2017/0323607 | A1* | 11/2017 | Yim | G09G 3/3648 |
| 2019/0258101 | A1* | 8/2019 | Yasui | G02F 1/137 |

FOREIGN PATENT DOCUMENTS

| | | |
|---|---|---|
| KR | 101456305 | 11/2014 |
| KR | 1020160076275 | 6/2016 |

* cited by examiner

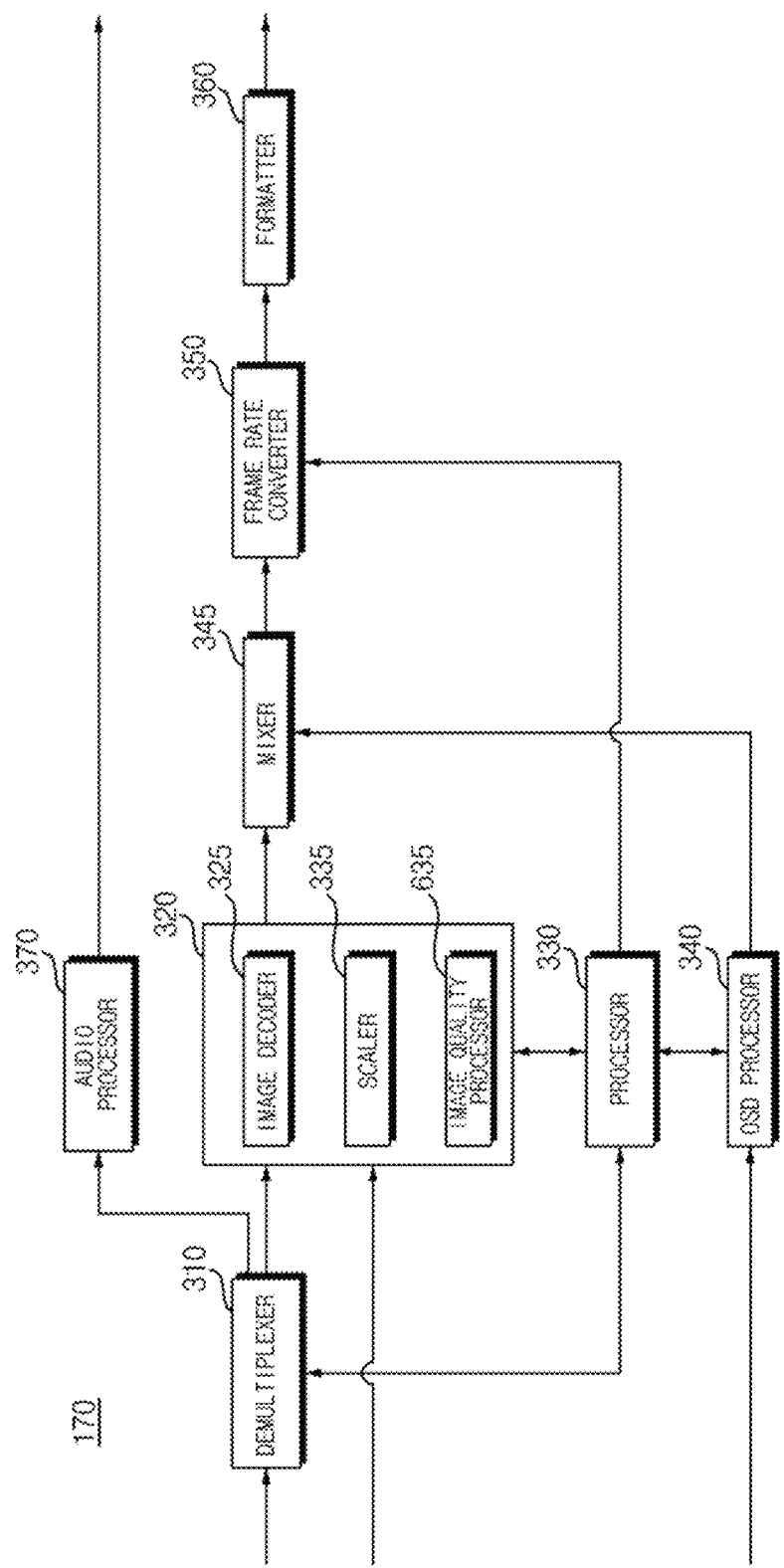

FIG. 10A
(a)
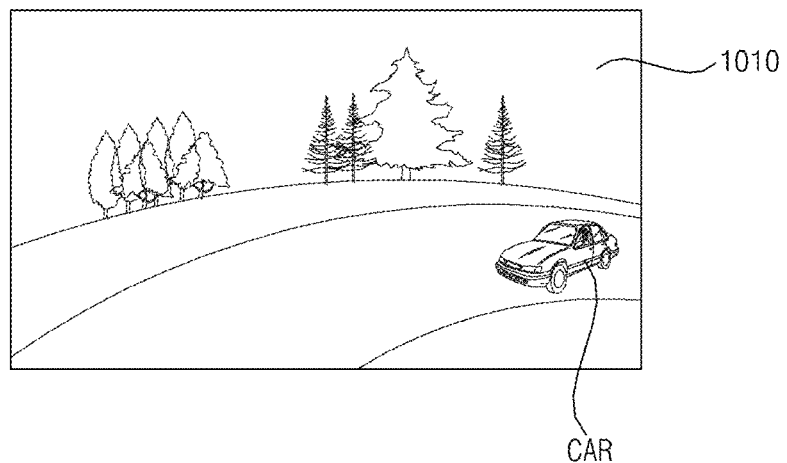
(b)
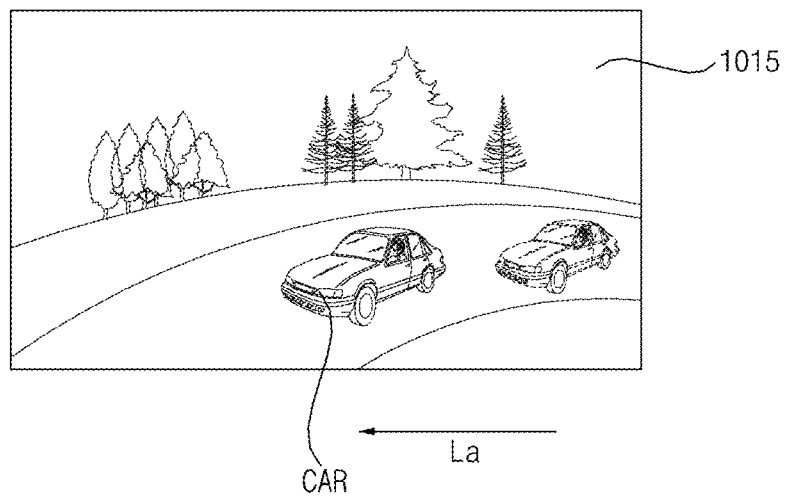

FIG. 10B
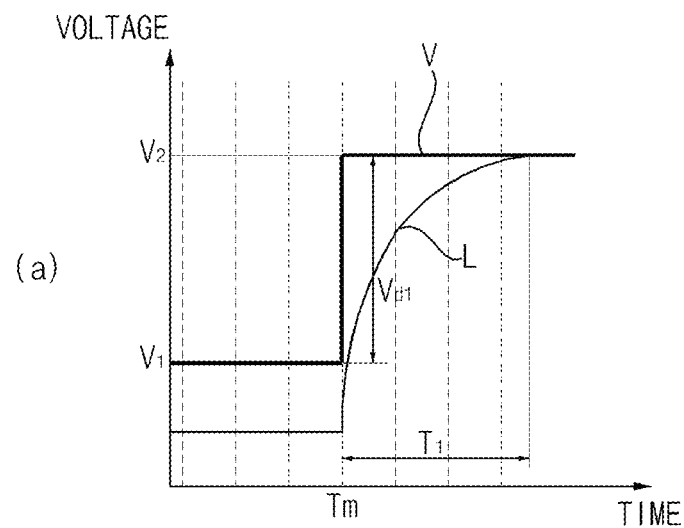
(a)
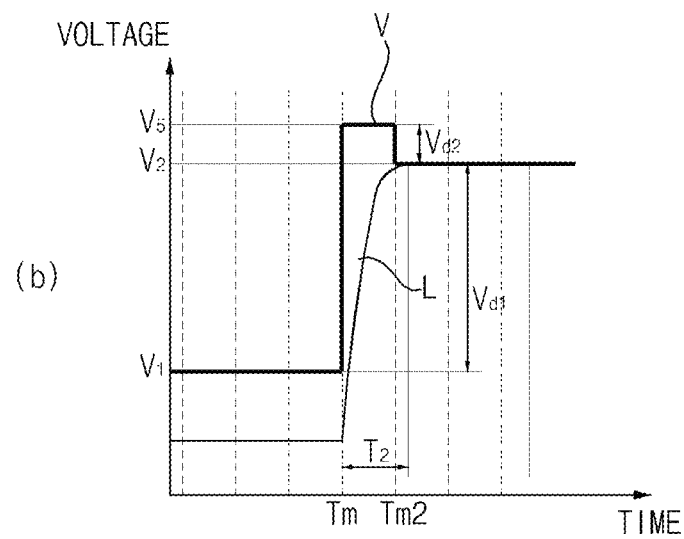
(b)

FIG. 10C
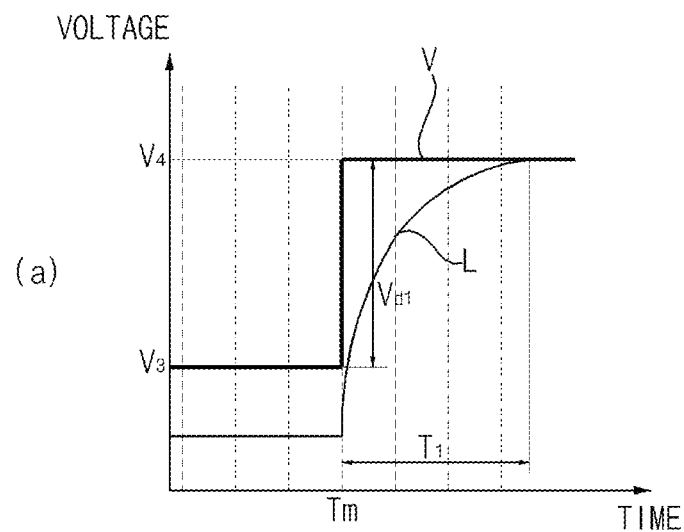
(a)
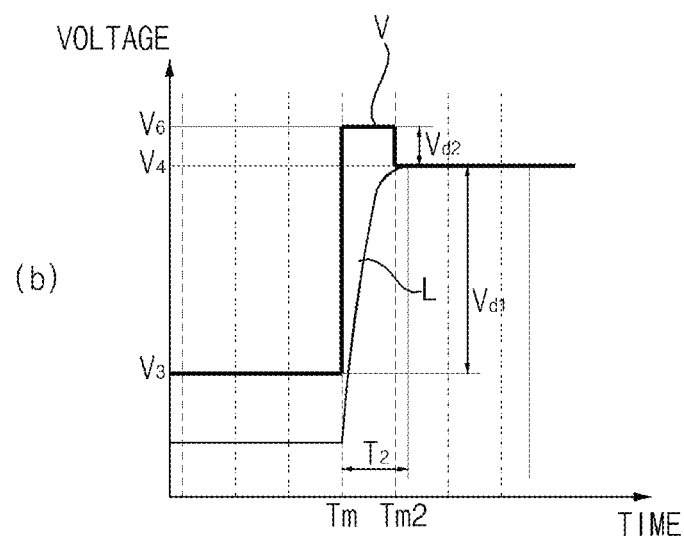
(b)

FIG. 11A
(a)
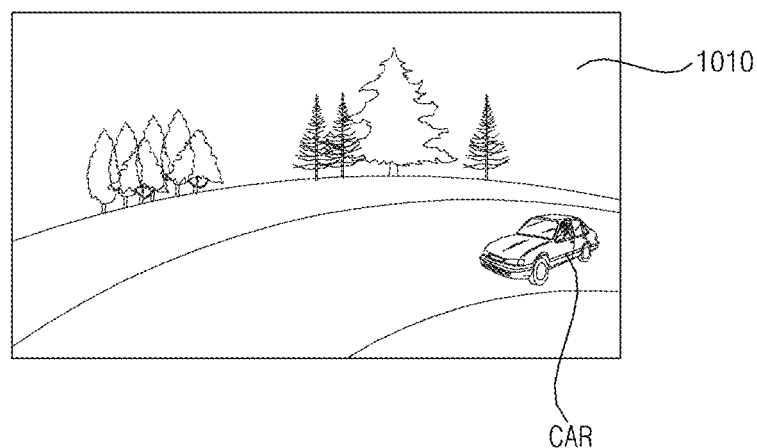
(b)
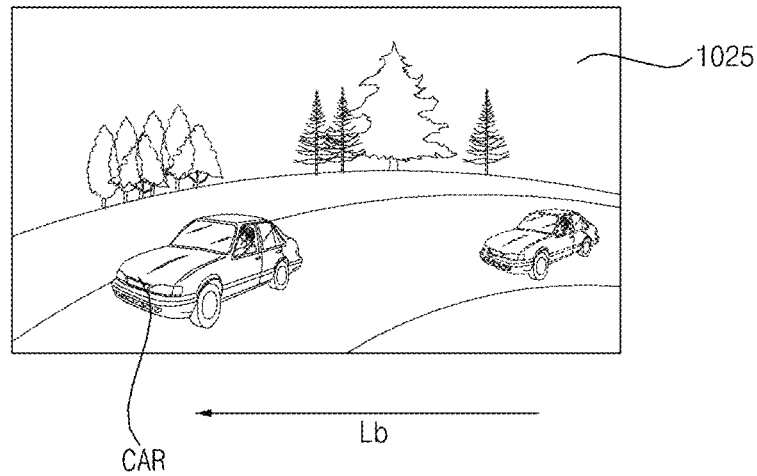

FIG. 11B
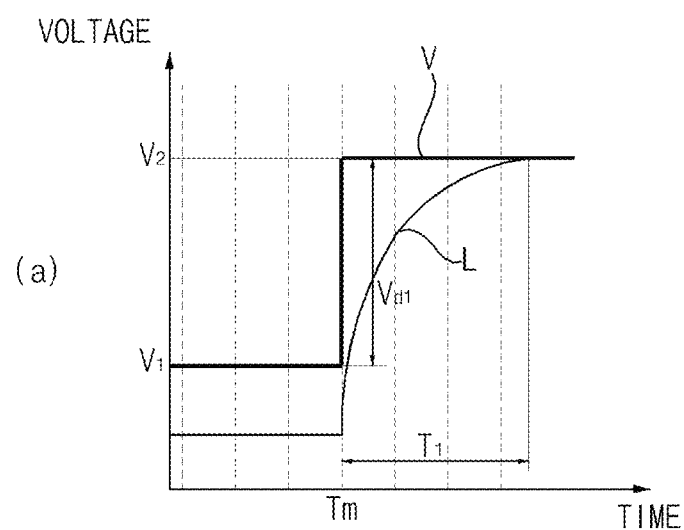
(a)
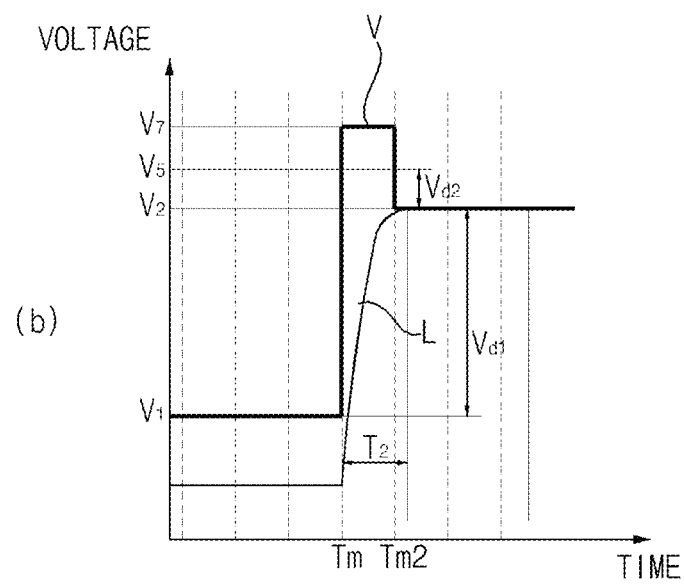
(b)

FIG. 11C
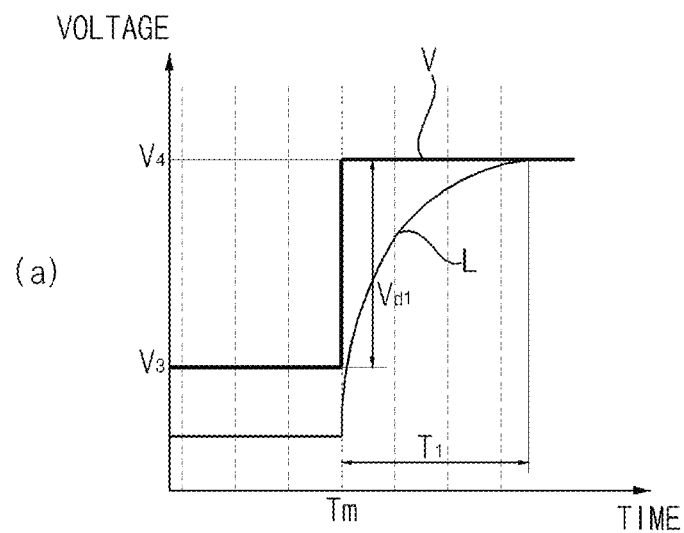
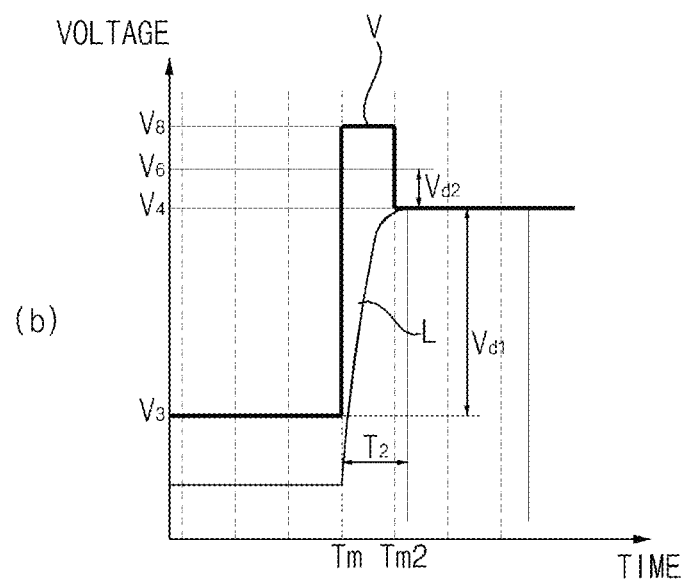

FIG. 11E
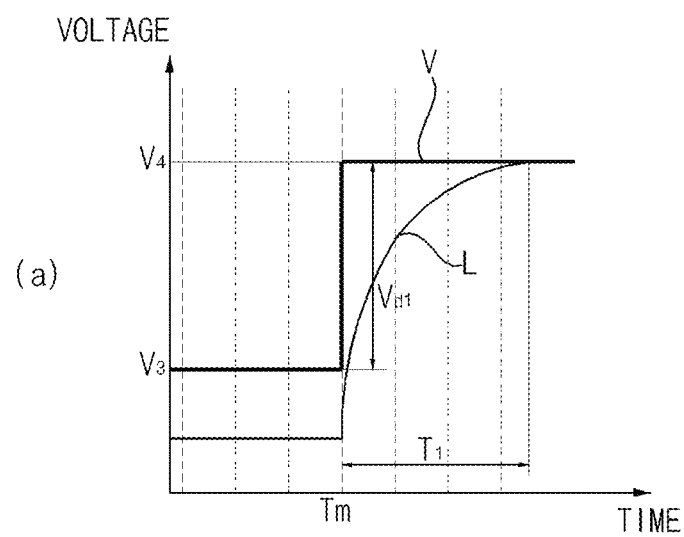
(a)
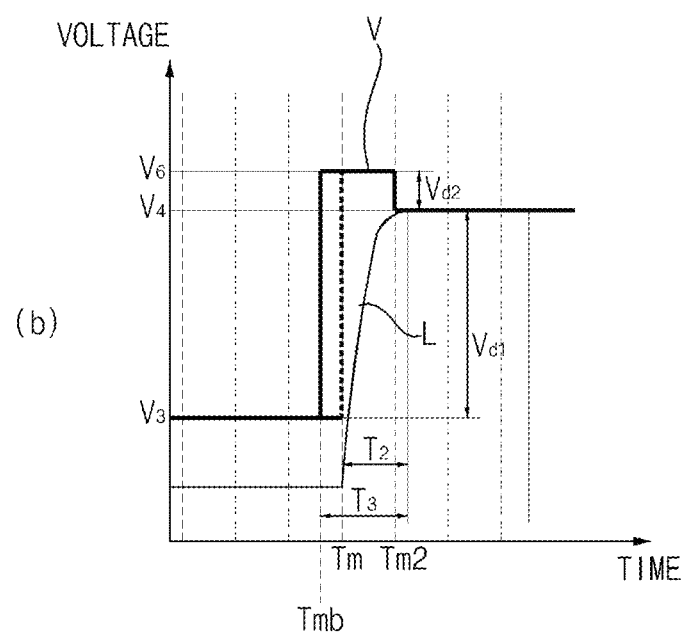
(b)

DISPLAY DEVICE AND IMAGE DISPLAY DEVICE COMPRISING SAME

CROSS-REFERENCE TO RELATED APPLICATIONS

This application is the National Stage filing under 35 U.S.C. 371 of International Application No. PCT/KR2020/005586, filed on Apr. 28, 2020, the contents of which are all incorporated by reference herein in their entirety.

BACKGROUND

1. Field of the Disclosure

The present disclosure relates to a display device and an image display apparatus including the same and more particularly, to a display device and an image display apparatus including the same capable of improving luminance expression power.

2. Description of the Related Art

An image display apparatus is a device with the function of providing an image that a user may watch. The user may watch various videos through the image display apparatus.

On the other hand, an image display apparatus includes a display device for image display.

When the display device includes a backlight, the luminance and color of an image are expressed using a TFT panel and a color filter that controls the amount of backlight penetration.

Meanwhile, various studies are being conducted to enhance the luminance and color expression power of an image.

SUMMARY

An object of the present disclosure is to provide a display device and an image display apparatus including the same capable of improving luminance expression power.

Another object of the present disclosure is to provide a display device and an image display apparatus including the same capable of improving color expression power.

Further another object of the present disclosure is to provide a display device and an image display apparatus including the same capable of improving contrast expression power.

To achieve the objects above, a display device and an image display apparatus including the same according to one embodiment of the present disclosure comprises a backlight, a first TFT panel including a plurality of switching elements and configured to control the amount of light penetration of the backlight for the respective areas corresponding to the plurality of switching elements, a second TFT panel including a plurality of switching elements and configured to control the amount of penetration of light output from the first TFT panel for the respective areas corresponding to the plurality of switching elements, and a color filter to filter the light output from the second TFT panel for each color, wherein, while a first voltage is applied to a first switching element of the first TFT panel, a second voltage higher than the first voltage is applied to the first switching element of the first TFT panel in response to an object within an image frame data input to the display device; while a third voltage is applied to a second switching element of the second TFT panel, a fourth voltage higher than the third voltage is applied to the second switching element of the second TFT panel in response to the object within the image frame data input to the display device; and in response to movement of the object within the image frame data input to the display device, a fifth voltage higher than the second voltage is applied to the first switching element of the first TFT panel, and a sixth voltage higher than the fourth voltage is applied to the second switching element of the second TFT panel.

Meanwhile, in response to movement of the object within the image frame data input to the display device, the fifth voltage higher than the second voltage may be applied to the first switching element of the first TFT panel, and the second voltage is applied after the fifth voltage may be applied; the sixth voltage higher than the fourth voltage may be applied to the second switching element of the second TFT panel, and the fourth voltage may be applied after the sixth voltage is applied.

Meanwhile, as the amount of the movement of the object increases, at least one of difference between the fifth voltage and the second voltage or difference between the sixth voltage and the fourth voltage may increase.

Meanwhile, as the amount of the movement of the object increases, the fifth voltage may increase, or the sixth voltage may increase.

Meanwhile, as the amount of the movement of the object increases, an application period of the fifth voltage may increase, or an application period of the sixth voltage may increase.

Meanwhile, the third voltage may be higher than the fourth voltage.

Meanwhile, in the case of a dynamic range mode, the second voltage may be different from the fourth voltage, and the fifth voltage may be different from the sixth voltage.

Meanwhile, in the case of not being in the dynamic range mode, the second voltage may be the same as the fourth voltage, and the fifth voltage may be the same as the sixth voltage.

To achieve the objects above, a display device and an image display apparatus including the same according to another embodiment of the present disclosure comprises a backlight, a first TFT panel including a plurality of switching elements and configured to control the amount of light penetration of the backlight for the respective areas corresponding to the plurality of switching elements, a second TFT panel including a plurality of switching elements and configured to control the amount of penetration of light output from the first TFT panel for the respective areas corresponding to the plurality of switching elements, and a color filter to filter the light output from the second TFT panel for each color, wherein, while a first voltage is applied to a first switching element of the first TFT panel, a second voltage higher than the first voltage is applied to the first switching element of the first TFT panel in response to an object within a first image frame data input to the display device; while a third voltage is applied to a second switching element of the second TFT panel, a fourth voltage higher than the third voltage is applied to the second switching element of the second TFT panel in response to an object within a second image frame data input to the display device; and in response to movement of the object within the first image frame data input to the display device, a fifth voltage higher than the second voltage is applied to the first switching element of the first TFT panel, and in response to movement of the object within the second image frame data input to the display device, a sixth voltage higher than the fourth voltage is applied to the second switching element of the second TFT panel.

Meanwhile, in response to movement of the object within the first image frame data input to the display device, the fifth voltage higher than the second voltage may be applied to the first switching element of the first TFT panel, and the second voltage may be applied after the fifth voltage is applied; in response to movement of the object within the second image frame data input to the display device, the sixth voltage higher than the fourth voltage may be applied to the second switching element of the second TFT panel, and the fourth voltage may be applied after the sixth voltage is applied.

Meanwhile, as the amount of the movement of the object within the first image frame data increases, difference between the fifth voltage and the second voltage may increase, and as the amount of the movement of the object within the second image frame data increases, difference between the sixth voltage and the fourth voltage may increase.

To achieve the objects above, a display device and an image display apparatus including the same according to further another embodiment of the present disclosure comprises a backlight, a first TFT panel including a plurality of switching elements and configured to control the amount of light penetration of the backlight for the respective areas corresponding to the plurality of switching elements, a first color filter to filter the light output from the first TFT panel for each color, a second TFT panel including a plurality of switching elements and configured to control the amount of penetration of light output from the first color filter for the respective areas corresponding to the plurality of switching elements, and a second color filter to filter the light output from the second TFT panel for each color, wherein, while a first voltage is applied to a first switching element of the first TFT panel, a second voltage higher than the first voltage is applied to the first switching element of the first TFT panel in response to an object within an image frame data input to the display device; while a third voltage is applied to a second switching element of the second TFT panel, a fourth voltage higher than the third voltage is applied to the second switching element of the second TFT panel in response to the object within the image frame data input to the display device; and in response to movement of the object within the image frame data input to the display device, a fifth voltage higher than the second voltage is applied to the first switching element of the first TFT panel, and a sixth voltage higher than the fourth voltage is applied to the second switching element of the second TFT panel.

Meanwhile, in response to movement of the object within the image frame data input to the display device, the fifth voltage higher than the second voltage may be applied to the first switching element of the first TFT panel, and the second voltage may be applied after the fifth voltage is applied; the sixth voltage higher than the fourth voltage may be applied to the second switching element of the second TFT panel, and the fourth voltage may be applied after the sixth voltage is applied.

Meanwhile, as the amount of the movement of the object increases, at least one of difference between the fifth voltage and the second voltage or difference between the sixth voltage and the fourth voltage may increase.

To achieve the objects above, a display device and an image display apparatus including the same according to still another embodiment of the present disclosure comprises a backlight, a first TFT panel including a plurality of switching elements and configured to control the amount of light penetration of the backlight for the respective areas corresponding to the plurality of switching elements, a first color filter to filter the light output from the first TFT panel for each color, a second TFT panel including a plurality of switching elements and configured to control the amount of penetration of light output from the first color filter for the respective areas corresponding to the plurality of switching elements, and a second color filter to filter the light output from the second TFT panel for each color, wherein, while a first voltage is applied to a first switching element of the first TFT panel, a second voltage higher than the first voltage is applied to the first switching element of the first TFT panel in response to an object within a first image frame data input to the display device; while a third voltage is applied to a second switching element of the second TFT panel, a fourth voltage higher than the third voltage is applied to the second switching element of the second TFT panel in response to an object within a second image frame data input to the display device; and in response to movement of the object within the first image frame data input to the display device, a fifth voltage higher than the second voltage is applied to the first switching element of the first TFT panel, and in response to movement of the object within the second image frame data input to the display device, a sixth voltage higher than the fourth voltage is applied to the second switching element of the second TFT panel.

Meanwhile, an image display apparatus according to an embodiment of the present disclosure includes a signal processor configured to output an image frame data to the display device.

Meanwhile, the signal processor may output a first image frame data for driving the first TFT panel and a second image frame data for driving the second TFT panel; and control at least one of luminance and color of the first image frame data and the second image frame data to be changed.

Meanwhile, the signal processor may be configured to perform at least one of dynamic range adjustment, contrast adjustment, color adjustment, or overdrive adjustment based on the movement or depth of an object of the first image frame data and the second image frame data.

Effects of the Disclosure

A display device and an image display apparatus including the same according to one embodiment of the present disclosure comprises a backlight, a first TFT panel including a plurality of switching elements and configured to control the amount of light penetration of the backlight for the respective areas corresponding to the plurality of switching elements, a second TFT panel including a plurality of switching elements and configured to control the amount of penetration of light output from the first TFT panel for the respective areas corresponding to the plurality of switching elements, and a color filter to filter the light output from the second TFT panel for each color, wherein, while a first voltage is applied to a first switching element of the first TFT panel, a second voltage higher than the first voltage is applied to the first switching element of the first TFT panel in response to an object within an image frame data input to the display device; while a third voltage is applied to a second switching element of the second TFT panel, a fourth voltage higher than the third voltage is applied to the second switching element of the second TFT panel in response to the object within the image frame data input to the display device; and in response to movement of the object within the image frame data input to the display device, a fifth voltage higher than the second voltage is applied to the first switching element of the first TFT panel, and a sixth voltage higher than the fourth voltage is applied to the second switching element of the second TFT panel. Accordingly, luminance expression power in the display device may be improved.

Meanwhile, in response to movement of the object within the image frame data input to the display device, the fifth voltage higher than the second voltage may be applied to the first switching element of the first TFT panel, and the second voltage may be applied after the fifth voltage is applied; the sixth voltage higher than the fourth voltage may be applied to the second switching element of the second TFT panel, and the fourth voltage may be applied after the sixth voltage is applied. Accordingly, in response to the amount of movement of an object, luminance expression power in the display device may be improved.

Meanwhile, as the amount of movement of an object increases, at least one of difference between the fifth voltage and the second voltage or difference between the sixth voltage and the fourth voltage may increase. Accordingly, in response to the amount of movement of an object, luminance expression power in the display device may be improved.

Meanwhile, as the amount of movement of an object increases, the fifth voltage may increase, or the sixth voltage may increase. Accordingly, in response to the amount of movement of an object, luminance expression power in the display device may be improved.

Meanwhile, as the amount of movement of an object increases, the application period of the fifth voltage may increase, or the application period of the sixth voltage may increase. Accordingly, in response to the amount of movement of an object, luminance expression power in the display device may be improved.

Meanwhile, in the case of a dynamic range mode, the second voltage may be different from the fourth voltage, and the fifth voltage may be different from the sixth voltage. Accordingly, based on the dynamic range mode, luminance expression power in the display device may be improved.

Meanwhile, in the case of not being in the dynamic range mode, the second voltage may be the same as the fourth voltage, and the fifth voltage may be the same as the sixth voltage. Accordingly, the first switching element and the second switching element may be driven in the same manner.

To achieve the objects above, a display device and an image display apparatus including the same according to another embodiment of the present disclosure comprises a backlight, a first TFT panel including a plurality of switching elements and configured to control the amount of light penetration of the backlight for the respective areas corresponding to the plurality of switching elements, a second TFT panel including a plurality of switching elements and configured to control the amount of penetration of light output from the first TFT panel for the respective areas corresponding to the plurality of switching elements, and a color filter to filter the light output from the second TFT panel for each color, wherein, while a first voltage is applied to a first switching element of the first TFT panel, a second voltage higher than the first voltage is applied to the first switching element of the first TFT panel in response to an object within a first image frame data input to the display device; while a third voltage is applied to a second switching element of the second TFT panel, a fourth voltage higher than the third voltage is applied to the second switching element of the second TFT panel in response to an object within a second image frame data input to the display device; and in response to movement of the object within the first image frame data input to the display device, a fifth voltage higher than the second voltage is applied to the first switching element of the first TFT panel, and in response to movement of the object within the second image frame data input to the display device, a sixth voltage higher than the fourth voltage is applied to the second switching element of the second TFT panel. Accordingly, luminance expression power in the display device may be improved.

Meanwhile, in response to movement of the object within the first image frame data input to the display device, the fifth voltage higher than the second voltage may be applied to the first switching element of the first TFT panel, and the second voltage may be applied after the fifth voltage is applied; in response to movement of the object within the second image frame data input to the display device, the sixth voltage higher than the fourth voltage may be applied to the second switching element of the second TFT panel, and the fourth voltage may be applied after the sixth voltage is applied. Accordingly, in response to the movement of an object, luminance expression power in the display device may be improved.

Meanwhile, as the amount of movement of an object within the first image frame data increases, difference between the fifth voltage and the second voltage may increase, and as the amount of movement of an object within the second image frame data increases, difference between the sixth voltage and the fourth voltage may increase. Accordingly, in response to the movement of an object, luminance expression power in the display device may be improved.

To achieve the objects above, a display device and an image display apparatus including the same according to further another embodiment of the present disclosure comprises a backlight, a first TFT panel including a plurality of switching elements and configured to control the amount of light penetration of the backlight for the respective areas corresponding to the plurality of switching elements, a first color filter to filter the light output from the first TFT panel for each color, a second TFT panel including a plurality of switching elements and configured to control the amount of penetration of light output from the first color filter for the respective areas corresponding to the plurality of switching elements, and a second color filter to filter the light output from the second TFT panel for each color, wherein, while a first voltage is applied to a first switching element of the first TFT panel, a second voltage higher than the first voltage is applied to the first switching element of the first TFT panel in response to an object within an image frame data input to the display device; while a third voltage is applied to a second switching element of the second TFT panel, a fourth voltage higher than the third voltage is applied to the second switching element of the second TFT panel in response to the object within the image frame data input to the display device; and in response to movement of the object within the image frame data input to the display device, a fifth voltage higher than the second voltage is applied to the first switching element of the first TFT panel, and a sixth voltage higher than the fourth voltage is applied to the second switching element of the second TFT panel. Accordingly, luminance expression power and color expression power in the display device may be improved.

Meanwhile, in response to movement of the object within the image frame data input to the display device, the fifth voltage higher than the second voltage may be applied to the first switching element of the first TFT panel, and the second voltage may be applied after the fifth voltage is applied; the sixth voltage higher than the fourth voltage may be applied to the second switching element of the second TFT panel, and the fourth voltage may be applied after the sixth voltage is applied. Accordingly, in response to the movement of an object, luminance expression power and color expression power in the display device may be improved.

Meanwhile, as the amount of movement of an object increases, at least one of difference between the fifth voltage and the second voltage or difference between the sixth voltage and the fourth voltage may increase. Accordingly, in response to the movement of an object, luminance expression power and color expression power in the display device may be improved.

To achieve the objects above, a display device and an image display apparatus including the same according to still another embodiment of the present disclosure comprises a backlight, a first TFT panel including a plurality of switching elements and configured to control the amount of light penetration of the backlight for the respective areas corresponding to the plurality of switching elements, a first color filter to filter the light output from the first TFT panel for each color, a second TFT panel including a plurality of switching elements and configured to control the amount of penetration of light output from the first color filter for the respective areas corresponding to the plurality of switching elements, and a second color filter to filter the light output from the second TFT panel for each color, wherein, while a first voltage is applied to a first switching element of the first TFT panel, a second voltage higher than the first voltage is applied to the first switching element of the first TFT panel in response to an object within a first image frame data input to the display device; while a third voltage is applied to a second switching element of the second TFT panel, a fourth voltage higher than the third voltage is applied to the second switching element of the second TFT panel in response to an object within a second image frame data input to the display device; and in response to movement of the object within the first image frame data input to the display device, a fifth voltage higher than the second voltage is applied to the first switching element of the first TFT panel, and in response to movement of the object within the second image frame data input to the display device, a sixth voltage higher than the fourth voltage is applied to the second switching element of the second TFT panel. Accordingly, luminance expression power and color expression power in the display device may be improved.

Meanwhile, the signal processor may output a first image frame data for driving the first TFT panel and a second image frame data for driving the second TFT panel; and control at least one of luminance and color of the first image frame data and the second image frame data to be changed. Accordingly, at least one of luminance expression power and color expression power in the display device may be improved.

Meanwhile, the signal processor may be configured to perform at least one of dynamic range adjustment, contrast adjustment, color adjustment, or overdrive adjustment based on the movement or depth of an object of the first image frame data and the second image frame data. Accordingly, at least one of expression power of dynamic range, contrast expression power, color expression power, and overdrive expression power may be improved.

BRIEF DESCRIPTION OF THE DRAWINGS

FIG. 3 is an example of an internal block diagram of the signal processor in FIG. 2.

FIGS. 8 to 11E are diagrams referred to in the description of FIG. 7.

DETAILED DESCRIPTION OF THE PREFERRED EMBODIMENTS

Hereinafter, the present disclosure will be described in detail with reference to the accompanying drawings.

With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
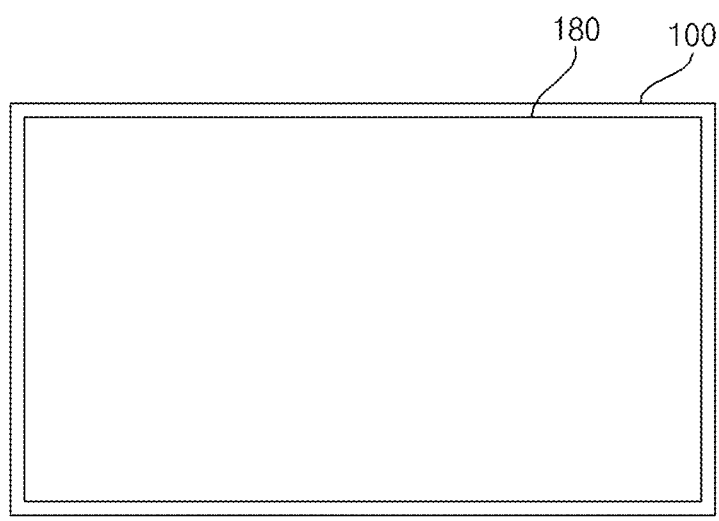
FIG. 1 is a diagram showing an image display system according to an embodiment of the present disclosure.

FIG. 1 is a diagram showing an image display apparatus according to an embodiment of the present disclosure.

Referring to the drawing, an image display apparatus 100 may include a display 180.

The display 180 may be implemented with any one of various panels. For example, the display 180 may be any one of a liquid crystal display panel (LCD panel), an organic light emitting diode panel (OLED panel), an inorganic light emitting diode panel (LED panel).

Meanwhile, the present disclosure assumes that the display 180 is a liquid crystal display (LCD) panel that requires a backlight.

When the display 180 is not self-luminous, the display 180 has to display an image through a backlight, a TFT panel, and a color filter; thus, luminance expression power or color expression power may deteriorate compared to the organic light emitting panel.

To solve the problem above, an embodiment of the present disclosure proposes a method for improving the luminance expression power by utilizing two TFT panels.

Another embodiment of the present disclosure proposes a method for improving luminance and color expression power by utilizing two TFT panels and two color filters.

A display device (800 of FIG. 7) according to one embodiment of the present disclosure comprises a backlight 250, a first TFT panel TFTa having a plurality of switching elements and configured to control the amount of light penetration of the backlight 250 for the respective areas corresponding to the plurality of switching elements, a second TFT panel TFTb having a plurality of switching elements and configured to control the amount of penetration of light output from the first TFT panel TFTa for the respective areas corresponding to the plurality of switching elements, and a color filter CFL filtering the light output from the second TFT panel TFTb for each color, wherein, while a first voltage V1 is applied to a first switching element SWa within a first pixel PXLa of the first TFT panel TFTa, a second voltage V2 higher than the first voltage V1 is applied to the first switching element SWa within the first pixel PXLa of the first TFT panel TFTa in response to an object CAR within an image frame data input to the display device 800; while a third voltage V3 is applied to a second switching element SWb within a second pixel PXLb of the second TFT panel TFTb, a fourth voltage V4 higher than the third voltage V3 is applied to the second switching element SWb within the second pixel PXLb of the second TFT panel TFTb in response to the object CAR within the image frame data input to the display device 800; and when the object CAR within the image frame data input to the display device 800 moves, a fifth voltage V5 higher than the second voltage V2 is applied to the first switching element SWa of the first TFT panel TFTa, and a sixth voltage V6 higher than the fourth voltage V4 is applied to the second switching element SWb within the second pixel PXLb of the second TFT panel TFTb. Accordingly, luminance expression power in the display device may be improved.

Meanwhile, a display device (800 of FIG. 7) according to another embodiment of the present disclosure comprises a backlight 250, a first TFT panel TFTa having a plurality of switching elements and configured to control the amount of light penetration of the backlight 250 for the respective areas corresponding to the plurality of switching elements, a second TFT panel TFTb having a plurality of switching elements and configured to control the amount of penetration of light output from the first TFT panel TFTa for the respective areas corresponding to the plurality of switching elements, and a color filter CFL filtering the light output from the second TFT panel TFTb for each color, wherein, while a first voltage V1 is applied to a first switching element SWa within a first pixel PXLa of the first TFT panel TFTa, a second voltage V2 higher than the first voltage V1 is applied to the first switching element SWa within the first pixel PXLa of the first TFT panel TFTa in response to an object CAR within a first image frame data Imga input to the display device 800; while a third voltage V3 is applied to a second switching element SWb within a second pixel PXLb of the second TFT panel TFTb, a fourth voltage V4 higher than the third voltage V3 is applied to the second switching element SWb within the second pixel PXLb of the second TFT panel TFTb in response to an object CAR within a second image frame data Imgb input to the display device 800; and when the object CAR within the first image frame data Imga input to the display device 800 moves, a fifth voltage V5 higher than the second voltage V2 is applied to the first switching element SWa of the first TFT panel TFTa, and when the object CAR within the second image frame data Imgb input to the display device 800 moves, a sixth voltage V6 higher than the fourth voltage V4 is applied to the second switching element SWb within the second pixel PXLb of the second TFT panel TFTb. Accordingly, luminance expression power in the display device may be improved.

Meanwhile, a display device 800 according to further another embodiment of the present disclosure comprises a backlight 250, a first TFT panel TFTa having a plurality of switching elements and configured to control the amount of light penetration of the backlight 250 for the respective areas corresponding to the plurality of switching elements, a first color filter CFLa filtering the light output from the first TFT panel TFTa for each color, a second TFT panel TFTb having a plurality of switching elements and configured to control the amount of penetration of light output from the first color filter CFLa for the respective areas corresponding to the plurality of switching elements, and a second color filter CFLb filtering the light output from the second TFT panel TFTb for each color, wherein, while a first voltage is applied to a first switching element SWa within a first pixel PXLa of the first TFT panel TFTa, a second voltage V2 higher than the first voltage V1 is applied to the first switching element SWa within the first pixel PXLa of the first TFT panel TFTa in response to an object CAR within an image frame data input to the display device 800; while a third voltage V3 is applied to a second switching element SWb within a second pixel PXLb of the second TFT panel TFTb, a fourth voltage V4 higher than the third voltage V3 is applied to the second switching element SWb within the second pixel PXLb of the second TFT panel TFTb in response to the object CAR within the image frame data input to the display device 800; and when the object CAR within the image frame data input to the display device 800 moves, a fifth voltage V5 higher than the second voltage V2 is applied to the first switching element SWa of the first TFT panel TFTa, and a sixth voltage V6 higher than the fourth voltage V4 is applied to the second switching element SWb within the second pixel PXLb of the second TFT panel TFTb. Accordingly, luminance expression power and color expression power in the display device may be improved.

Meanwhile, a display device 800 according to still another embodiment of the present disclosure comprises a backlight 250, a first TFT panel TFTa having a plurality of switching elements and configured to control the amount of light penetration of the backlight 250 for the respective areas corresponding to the plurality of switching elements, a first color filter CFLa filtering the light output from the first TFT panel TFTa for each color, a second TFT panel TFTb having a plurality of switching elements and configured to control the amount of penetration of light output from the first color filter CFLa for the respective areas corresponding to the plurality of switching elements, and a second color filter CFLb filtering the light output from the second TFT panel TFTb for each color, wherein, while a first voltage V1 is applied to a first switching element SWa within a first pixel PXLa of the first TFT panel TFTa, a second voltage V2 higher than the first voltage V1 is applied to the first switching element SWa within the first pixel PXLa of the first TFT panel TFTa in response to an object within a first image frame data Imga input to the display device 800; while a third voltage V3 is applied to a second switching element SWb of the second TFT panel TFTb, a fourth voltage V4 higher than the third voltage V3 is applied to the second switching element SWb within a second pixel PXLb of the second TFT panel TFTb in response to an object CAR within a second image frame data Imgb input to the display device 800; and when the object CAR within the first image frame data Imga input to the display device 800 moves, a fifth voltage V5 higher than the second voltage V2 is applied to the first switching element SWa of the first TFT panel TFTa, and when the object CAR within the second image frame data Imgb input to the display device 800 moves, a sixth voltage V6 higher than the fourth voltage V4 is applied to the second switching element SWb within the second pixel PXLb of the second TFT panel TFTb. Accordingly, luminance expression power and color expression power in the display device may be improved.

Meanwhile, the image display apparatus 100 in FIG. 1 may be a monitor, a TV, a tablet PC, a mobile terminal, a display for a vehicle, etc.

Figure 2:
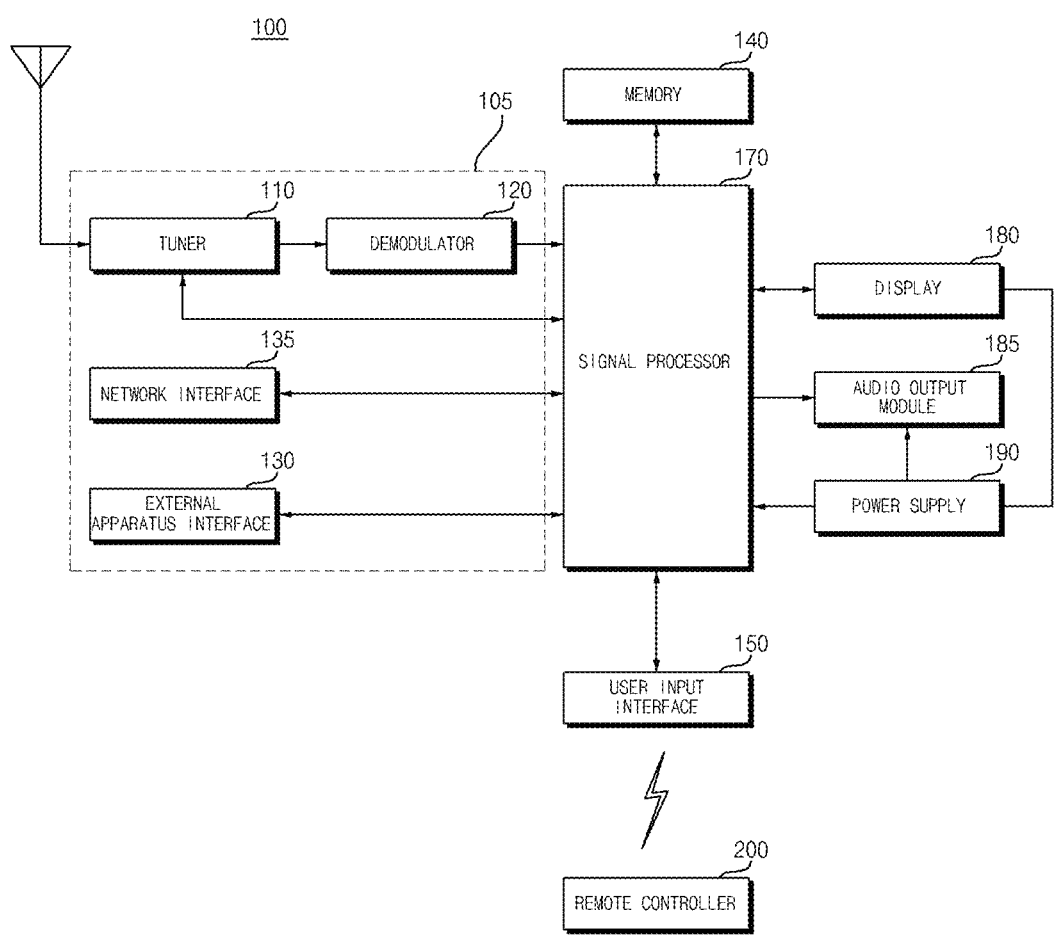
FIG. 2 is an example of an internal block diagram of the image display apparatus of FIG. 1.

FIG. 2 is an example of an internal block diagram of the image display apparatus of FIG. 1.

Referring to FIG. 2, the image display apparatus 100 according to an embodiment of the present disclosure includes an image receiver 105, an external apparatus interface 130, a memory 140, a user input interface 150, a sensor device (not shown), a signal processor 170, a display 180, and an audio output device 185.

The image receiver 105 may include a tuner 110, a demodulator 120, a network interface 135, and an external apparatus interface 130.

Meanwhile, unlike the drawing, the image receiver 105 may include only the tuner 110, the demodulator 120, and the external apparatus interface 130. That is, the network interface 135 may not be included.

The tuner 110 selects an RF broadcast signal corresponding to a channel selected by a user or all prestored channels among radio frequency (RF) broadcast signals received through an antenna (not shown). In addition, the selected RF broadcast signal is converted into an intermediate frequency signal, a baseband image, or an audio signal.

For example, if the selected RF broadcast signal is a digital broadcast signal, it is converted into a digital IF signal (DIF). If the selected RF broadcast signal is an analog broadcast signal, it is converted into an analog baseband image or audio signal (CVBS/SIF). That is, the tuner 110 can process a digital broadcast signal or an analog broadcast signal. The analog baseband image or audio signal (CVBS/SIF) output from the tuner 110 may be directly input to the signal processor 170.

Meanwhile, the tuner 110 can include a plurality of tuners for receiving broadcast signals of a plurality of channels. Alternatively, a single tuner that simultaneously receives broadcast signals of a plurality of channels is also available.

The demodulator 120 receives the converted digital IF signal DIF from the tuner 110 and performs a demodulation operation.

The demodulator 120 may perform demodulation and channel decoding and then output a stream signal TS. At this time, the stream signal may be a multiplexed signal of an image signal, an audio signal, or a data signal.

The stream signal output from the demodulator 120 may be input to the signal processor 170. The signal processor 170 performs demultiplexing, image/audio signal processing, and the like, and then outputs an image to the display 180 and outputs audio to the audio output device 185.

The external apparatus interface 130 may transmit or receive data with a connected external apparatus (not shown), e.g., a set-top box 50. To this end, the external apparatus interface 130 may include an A/V input and output device (not shown).

The external apparatus interface 130 may be connected in wired or wirelessly to an external apparatus such as a digital versatile disk (DVD), a Blu ray, a game equipment, a camera, a camcorder, a computer(notebook), and a set-top box, and may perform an input/output operation with an external apparatus.

The A/V input and output device may receive image and audio signals from an external apparatus. Meanwhile, a wireless transceiver (not shown) may perform short range wireless communication with other electronic apparatus.

Through the wireless transceiver (not shown), the external apparatus interface 130 may exchange data with an adjacent mobile terminal 600. In particular, in a mirroring mode, the external apparatus interface 130 may receive device information, executed application information, application image, and the like from the mobile terminal 600.

The network interface 135 provides an interface for connecting the image display apparatus 100 to a wired/wireless network including the Internet network. For example, the network interface 135 may receive, via the network, content or data provided by the Internet, a content provider, or a network operator.

Meanwhile, the network interface 135 may include a wireless transceiver (not shown).

The memory 140 may store a program for each signal processing and control in the signal processor 170, and may store signal processed image, audio, or data signal.

In addition, the memory 140 may serve to temporarily store image, audio, or data signal input to the external apparatus interface 130. In addition, the memory 140 may store information on a certain broadcast channel through a channel memory function such as a channel map.

Although FIG. 2 illustrates that the memory is provided separately from the signal processor 170, the scope of the present disclosure is not limited thereto. The memory 140 may be included in the signal processor 170.

The user input interface 150 transmits a signal input by the user to the signal processor 170 or transmits a signal from the signal processor 170 to the user.

For example, it may transmit/receive a user input signal such as power on/off, channel selection, screen setting, etc., from a remote controller 200, may transfer a user input signal input from a local key (not shown) such as a power key, a channel key, a volume key, a set value, etc., to the signal processor 170, may transfer a user input signal input from a sensor device (not shown) that senses a user's gesture to the signal processor 170, or may transmit a signal from the signal processor 170 to the sensor device (not shown).

The signal processor 170 may demultiplex the input stream through the tuner 110, the demodulator 120, the network interface 135, or the external apparatus interface 130, or process the demultiplexed signals to generate and output a signal for image or audio output.

For example, the signal processor 170 is configured to receive a broadcast signal received by the image receiver 105 or an HDMI signal, and perform signal processing based on the received broadcast signal or the HDMI signal to thereby output a processed image signal.

The image signal processed by the signal processor 170 is input to the display 180, and may be displayed as an image corresponding to the image signal. In addition, the image signal processed by the signal processor 170 may be input to the external output apparatus through the external apparatus interface 130.

The audio signal processed by the signal processor 170 may be output to the audio output device 185 as an audio signal. In addition, audio signal processed by the signal processor 170 may be input to the external output apparatus through the external apparatus interface 130.

Although not shown in FIG. 2, the signal processor 170 may include a demultiplexer, an image processor, and the like. That is, the signal processor 170 may perform a variety of signal processing and thus it may be implemented in the form of a system on chip (SOC). This will be described later with reference to FIG. 3.

In addition, the signal processor 170 can control the overall operation of the image display apparatus 100. For example, the signal processor 170 may control the tuner 110 to control the tuning of the RF broadcast corresponding to the channel selected by the user or the previously stored channel.

In addition, the signal processor 170 may control the image display apparatus 100 according to a user command input through the user input interface 150 or an internal program.

Meanwhile, the signal processor 170 may control the display 180 to display an image. At this time, the image displayed on the display 180 may be a still image or a moving image, and may be a 2D image or a 3D image.

Meanwhile, the signal processor 170 may display a certain object in an image displayed on the display 180. For example, the object may be at least one of a connected web screen (newspaper, magazine, etc.), an electronic program guide (EPG), various menus, a widget, an icon, a still image, a moving image, or a text.

Meanwhile, the signal processor 170 may recognize the position of the user based on the image photographed by a photographing device (not shown). For example, the distance (z-axis coordinate) between a user and the image display apparatus 100 can be determined. In addition, the x-axis coordinate and the y-axis coordinate in the display 180 corresponding to a user position can be determined.

The display 180 generates a driving signal by converting an image signal, a data signal, an OSD signal, a control signal processed by the signal processor 170, an image signal, a data signal, a control signal, and the like received from the external apparatus interface 130.

Meanwhile, the display 180 may be configured as a touch screen and used as an input device in addition to an output device.

The audio output device 185 receives a signal processed by the signal processor 170 and outputs it as an audio.

The photographing device (not shown) photographs a user. The photographing device (not shown) may be implemented by a single camera, but the present disclosure is not limited thereto and may be implemented by a plurality of cameras. Image information photographed by the photographing device (not shown) may be input to the signal processor 170.

The signal processor 170 may sense a gesture of the user based on each of the images photographed by the photographing device (not shown), the signals detected from the sensor device (not shown), or a combination thereof.

The power supply 190 supplies corresponding power to the image display apparatus 100. Particularly, the power may be supplied to a controller 170 which can be implemented in the form of a system on chip (SOC), a display 180 for displaying an image, and an audio output device 185 for outputting an audio.

Specifically, the power supply 190 may include a converter for converting an AC power into a DC power, and a DC/DC converter for converting the level of the DC power.

The remote controller 200 transmits the user input to the user input interface 150. To this end, the remote controller 200 may use Bluetooth, a radio frequency (RF) communication, an infrared (IR) communication, an Ultra Wideband (UWB), ZigBee, or the like. In addition, the remote controller 200 may receive the image, audio, or data signal output from the user input interface 150, and display it on the remote controller 200 or output it as an audio.

Meanwhile, the image display apparatus 100 may be a fixed or mobile digital broadcasting receiver capable of receiving digital broadcasting.

Meanwhile, a block diagram of the image display apparatus 100 shown in FIG. 2 is a block diagram for an embodiment of the present disclosure. Each component of the block diagram may be integrated, added, or omitted according to a specification of the image display apparatus 100 actually implemented. That is, two or more components may be combined into a single component as needed, or a single component may be divided into two or more components. The function performed in each block is described for the purpose of illustrating embodiments of the present disclosure, and specific operation and apparatus do not limit the scope of the present disclosure.

FIG. 3 is an example of an internal block diagram of the signal processor in FIG. 2.

Referring to the drawing, the signal processor 170 according to an embodiment of the present disclosure may include a demultiplexer 310, an image processor 320, a processor 330, and an audio processor 370. In addition, the signal processor 170 may further include and a data processor (not shown).

The demultiplexer 310 demultiplexes the input stream. For example, when an MPEG-2 TS is input, it can be demultiplexed into image, audio, and data signal, respectively. Here, the stream signal input to the demultiplexer 310 may be a stream signal output from the tuner 110, the demodulator 120, or the external apparatus interface 130.

The image processor 320 may perform signal processing on an input image. For example, the image processor 320 may perform image processing on an image signal demultiplexed by the demultiplexer 310.

To this end, the image processor 320 may include an image decoder 325, a scaler 335, an image quality processor 635, an image encoder (not shown), an OSD processor 340, a frame rate converter 350, a formatter 360, etc.

The image decoder 325 decodes a demultiplexed image signal, and the scaler 335 performs scaling so that the resolution of the decoded image signal can be output from the display 180.

The image decoder 325 can include a decoder of various standards. For example, a 3D image decoder for MPEG-2, H.264 decoder, a color image, and a depth image, and a decoder for a multiple view image may be provided.

The scaler 335 may scale an input image signal decoded by the image decoder 325 or the like.

For example, if the size or resolution of an input image signal is small, the scaler 335 may upscale the input image signal, and, if the size or resolution of the input image signal is great, the scaler 335 may downscale the input image signal.

The image quality processor 635 may perform image quality processing on an input image signal decoded by the image decoder 325 or the like.

For example, the image quality processor 625 may perform noise reduction processing on an input image signal, extend a resolution of high gray level of the input image signal, perform image resolution enhancement, perform signal processing based on high dynamic range (HDR), change a frame rate, perform image quality processing suitable for properties of a panel, especially an OLED panel, etc.

The OSD processor 340 generates an OSD signal according to a user input or by itself. For example, based on a user input signal, the OSD processor 340 may generate a signal for displaying various pieces of information as a graphic or a text on the screen of the display 180. The generated OSD signal may include various data such as a user interface screen of the image display apparatus 100, various menu screens, a widget, and an icon. In addition, the generated OSD signal may include a 2D object or a 3D object.

In addition, the OSD processor 340 may generate a pointer that can be displayed on the display, based on a pointing signal input from the remote controller 200. In particular, such a pointer may be generated by a pointing signal processor, and the OSD processor 340 may include such a pointing signal processor (not shown). Obviously, the pointing signal processor (not shown) may be provided separately from the OSD processor 340.

A frame rate converter (FRC) 350 may convert a frame rate of an input image. The FRC 350 may output the input image without changes.

Meanwhile, the formatter 360 may change a format of an input image signal into a format suitable for displaying the image signal on a display and output the image signal in the changed format.

In particular, the formatter 360 may change a format of an image signal to correspond to a display panel.

Meanwhile, the formatter 360 may change the format of the image signal. For example, it may change the format of the 3D image signal into any one of various 3D formats such as a side by side format, a top/down format, a frame sequential format, an interlaced format, a checker box format, and the like.

The processor 330 may control overall operations of the image display apparatus 100 or the signal processor 170.

For example, the processor 330 may control the tuner 110 to control the tuning of an RF broadcast corresponding to a channel selected by a user or a previously stored channel.

In addition, the processor 330 may control the image display apparatus 100 according to a user command input through the user input interface 150 or an internal program.

In addition, the processor 330 may transmit data to the network interface 135 or to the external apparatus interface 130.

In addition, the processor 330 may control the demultiplexer 310, the image processor 320, and the like in the signal processor 170.

Meanwhile, the audio processor 370 in the signal processor 170 may perform the audio processing of the demultiplexed audio signal. To this end, the audio processor 370 may include various decoders.

In addition, the audio processor 370 in the signal processor 170 may process a base, a treble, a volume control, and the like.

The data processor (not shown) in the signal processor 170 may perform data processing of the demultiplexed data signal. For example, when the demultiplexed data signal is a coded data signal, it can be decoded. The encoded data signal may be electronic program guide information including broadcast information such as a start time and an end time of a broadcast program broadcasted on each channel.

Meanwhile, a block diagram of the signal processor 170 shown in FIG. 3 is a block diagram for an embodiment of the present disclosure. Each component of the block diagram may be integrated, added, or omitted according to a specification of the signal processor 170 actually implemented.

In particular, the frame rate converter 350 and the formatter 360 may be provided separately in addition to the image processor 320.

Figure 4A:
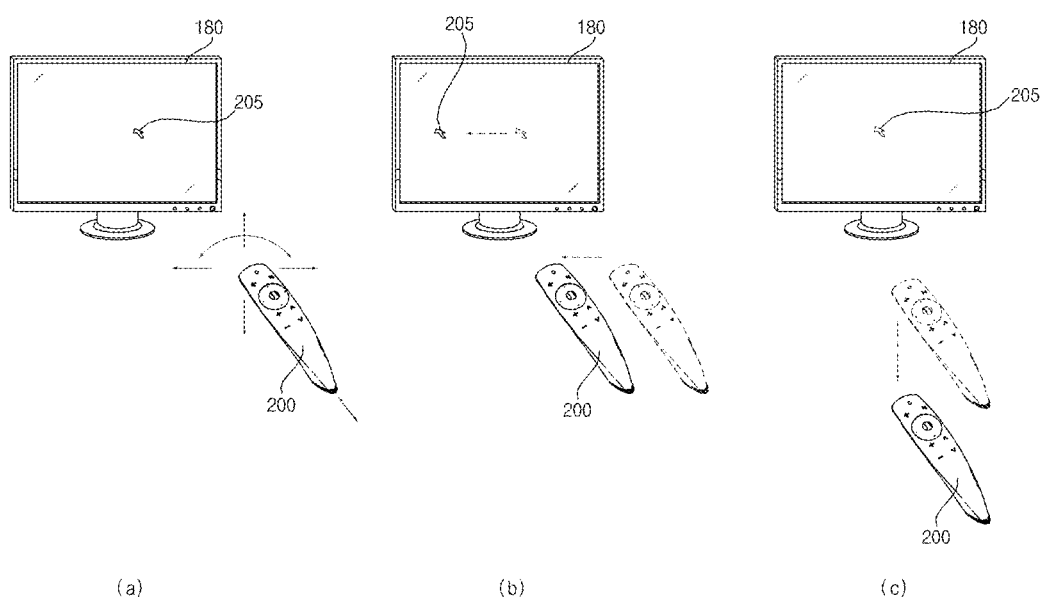
FIG. 4A is a diagram illustrating a control method of a remote controller of FIG. 2.

FIG. 4A is a diagram illustrating a control method of a remote controller of FIG. 2.

As shown in FIG. 4A(a), it is illustrated that a pointer 205 corresponding to the remote controller 200 is displayed on the display 180.

The user may move or rotate the remote controller 200 up and down, left and right (FIG. 4A(b)), and back and forth (FIG. 4A(c)). The pointer 205 displayed on the display 180 of the image display apparatus corresponds to the motion of the remote controller 200. Such a remote controller 200 may be referred to as a space remote controller or a 3D pointing apparatus, because the pointer 205 is moved and displayed according to the movement in a 3D space, as shown in the drawing.

FIG. 4A(b) illustrates that when the user moves the remote controller 200 to the left, the pointer 205 displayed on the display 180 of the image display apparatus also moves to the left correspondingly.

Information on the motion of the remote controller 200 detected through a sensor of the remote controller 200 is transmitted to the image display apparatus. The image display apparatus may calculate the coordinate of the pointer 205 from the information on the motion of the remote controller 200. The image display apparatus may display the pointer 205 to correspond to the calculated coordinate.

FIG. 4A(c) illustrates a case where the user moves the remote controller 200 away from the display 180 while pressing a specific button of the remote controller 200. Thus, a selection area within the display 180 corresponding to the pointer 205 may be zoomed in so that it can be displayed to be enlarged. On the other hand, when the user moves the remote controller 200 close to the display 180, the selection area within the display 180 corresponding to the pointer 205 may be zoomed out so that it can be displayed to be reduced. Meanwhile, when the remote controller 200 moves away from the display 180, the selection area may be zoomed out, and when the remote controller 200 approaches the display 180, the selection area may be zoomed in.

Meanwhile, when the specific button of the remote controller 200 is pressed, it is possible to exclude the recognition of vertical and lateral movement. That is, when the remote controller 200 moves away from or approaches the display 180, the up, down, left, and right movements are not recognized, and only the forward and backward movements are recognized. Only the pointer 205 is moved according to the up, down, left, and right movements of the remote controller 200 in a state where the specific button of the remote controller 200 is not pressed.

Meanwhile, the moving speed or the moving direction of the pointer 205 may correspond to the moving speed or the moving direction of the remote controller 200.

Figure 4B:
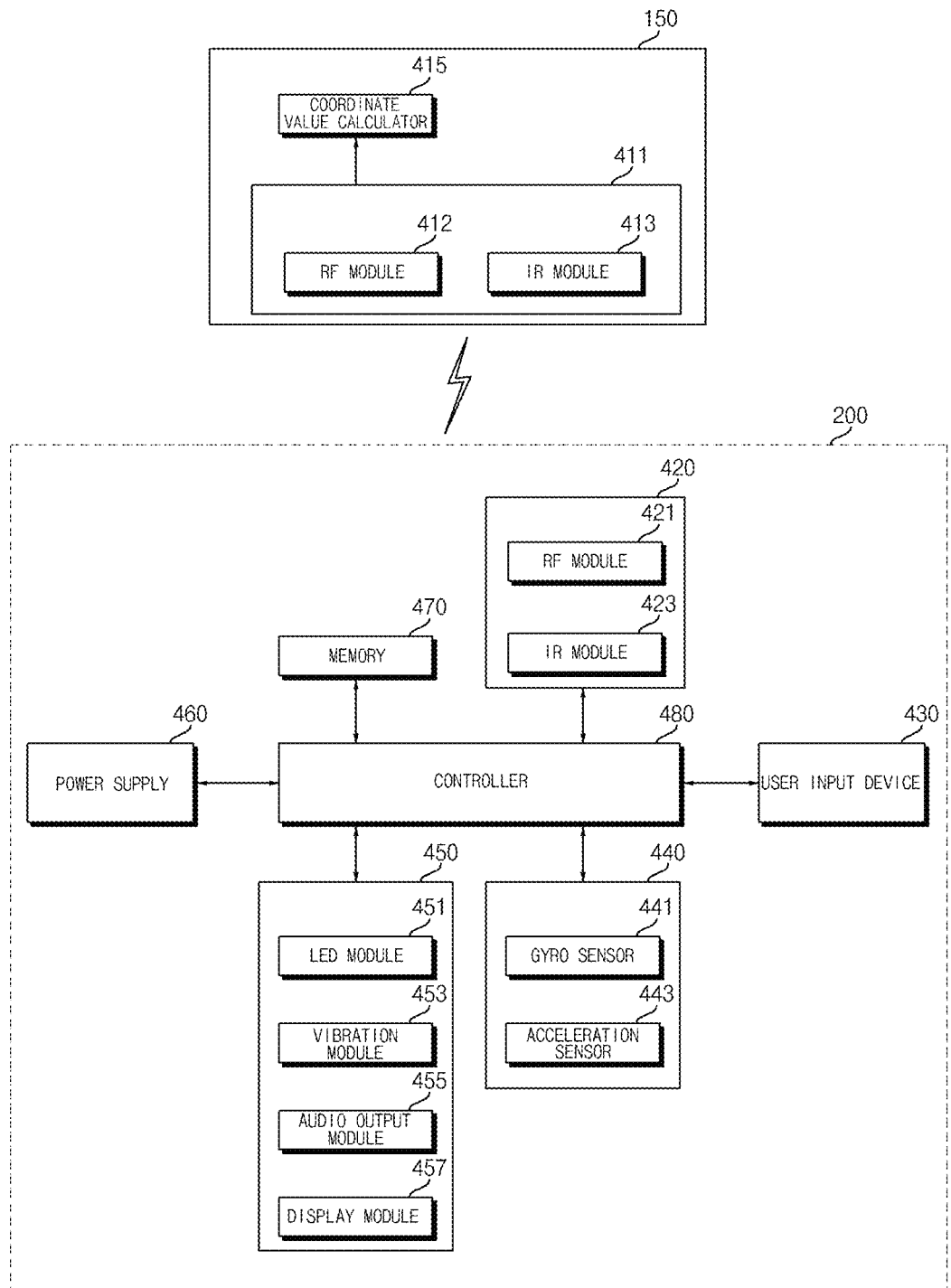
FIG. 4B is an internal block diagram of the remote controller of FIG. 2.

FIG. 4B is an internal block diagram of the remote controller of FIG. 2.

Referring to the drawing, the remote controller 200 includes a wireless transceiver 425, a user input device 435, a sensor device 440, an output device 450, a power supply 460, a memory 470, and a controller 480.

The wireless transceiver 425 transmits/receives a signal to/from any one of the image display apparatuses according to the embodiments of the present disclosure described above. Among the image display apparatuses according to the embodiments of the present disclosure, one image display apparatus 100 will be described as an example.

In the present embodiment, the remote controller 200 may include an RF module 421 for transmitting and receiving signals to and from the image display apparatus 100 according to a RF communication standard. In addition, the remote controller 200 may include an IR module 423 for transmitting and receiving signals to and from the image display apparatus 100 according to a IR communication standard.

In the present embodiment, the remote controller 200 transmits a signal containing information on the motion of the remote controller 200 to the image display apparatus 100 through the RF module 421.

In addition, the remote controller 200 may receive the signal transmitted by the image display apparatus 100 through the RF module 421. In addition, if necessary, the remote controller 200 may transmit a command related to power on/off, channel change, volume change, and the like to the image display apparatus 100 through the IR module 423.

The user input device 435 may be implemented by a keypad, a button, a touch pad, a touch screen, or the like. The user may operate the user input device 435 to input a command related to the image display apparatus 100 to the remote controller 200. When the user input device 435 includes a hard key button, the user can input a command related to the image display apparatus 100 to the remote controller 200 through a push operation of the hard key button. When the user input device 435 includes a touch screen, the user may touch a soft key of the touch screen to input the command related to the image display apparatus 100 to the remote controller 200. In addition, the user input device 435 may include various types of input means such as a scroll key, a jog key, etc., which can be operated by the user, and the present disclosure does not limit the scope of the present disclosure.

The sensor device 440 may include a gyro sensor 441 or an acceleration sensor 443. The gyro sensor 441 may sense information about the motion of the remote controller 200.

For example, the gyro sensor 441 may sense information on the operation of the remote controller 200 based on the x, y, and z axes. The acceleration sensor 443 may sense information on the moving speed of the remote controller 200. Meanwhile, a distance measuring sensor may be further provided, and thus, the distance to the display 180 may be sensed.

The output device 450 may output an image or an audio signal corresponding to the operation of the user input device 435 or a signal transmitted from the image display apparatus 100. Through the output device 450, the user may recognize whether the user input device 435 is operated or whether the image display apparatus 100 is controlled.

For example, the output device 450 may include an LED module 451 that is turned on when the user input device 435 is operated or a signal is transmitted/received to/from the image display apparatus 100 through the wireless transceiver 425, a vibration module 453 for generating a vibration, an audio output device 455 for outputting an audio, or a display module 457 for outputting an image.

The power supply 460 supplies power to the remote controller 200. When the remote controller 200 is not moved for a certain time, the power supply 460 may stop the supply of power to reduce a power waste. The power supply 460 may resume power supply when a certain key provided in the remote controller 200 is operated.

The memory 470 may store various types of programs, application data, and the like necessary for the control or operation of the remote controller 200. If the remote controller 200 wirelessly transmits and receives a signal to/from the image display apparatus 100 through the RF module 421, the remote controller 200 and the image display apparatus 100 transmit and receive a signal through a certain frequency band. The controller 480 of the remote controller 200 may store information about a frequency band or the like for wirelessly transmitting and receiving a signal to/from the image display apparatus 100 paired with the remote controller 200 in the memory 470 and may refer to the stored information.

The controller 480 controls various matters related to the control of the remote controller 200. The controller 480 may transmit a signal corresponding to a certain key operation of the user input device 435 or a signal corresponding to the motion of the remote controller 200 sensed by the sensor device 440 to the image display apparatus 100 through the wireless transceiver 425.

The user input interface 150 of the image display apparatus 100 includes a wireless transceiver 151 that can wirelessly transmit and receive a signal to and from the remote controller 200 and a coordinate value calculator 415 that can calculate the coordinate value of a pointer corresponding to the operation of the remote controller 200.

The user input interface 150 may wirelessly transmit and receive a signal to and from the remote controller 200 through the RF module 412. In addition, the user input interface 150 may receive a signal transmitted by the remote controller 200 through the IR module 413 according to an IR communication standard.

The coordinate value calculator 415 may correct a handshake or an error from a signal corresponding to the operation of the remote controller 200 received through the wireless transceiver 151 and may calculate the coordinate value (x, y) of the pointer 205 to be displayed on the display 180.

The transmission signal of the remote controller 200 inputted to the image display apparatus 100 through the user input interface 150 is transmitted to the controller 180 of the image display apparatus 100. The controller 180 may determine the information on the operation of the remote controller 200 and the key operation from the signal transmitted from the remote controller 200, and, correspondingly, control the image display apparatus 100.

For another example, the remote controller 200 may calculate the pointer coordinate value corresponding to the operation and output it to the user input interface 150 of the image display apparatus 100. In this case, the user input interface 150 of the image display apparatus 100 may transmit information on the received pointer coordinate value to the controller 180 without a separate correction process of handshake or error.

For another example, unlike the drawing, the coordinate value calculator 415 may be provided in the signal processor 170, not in the user input interface 150.

Figure 5A:
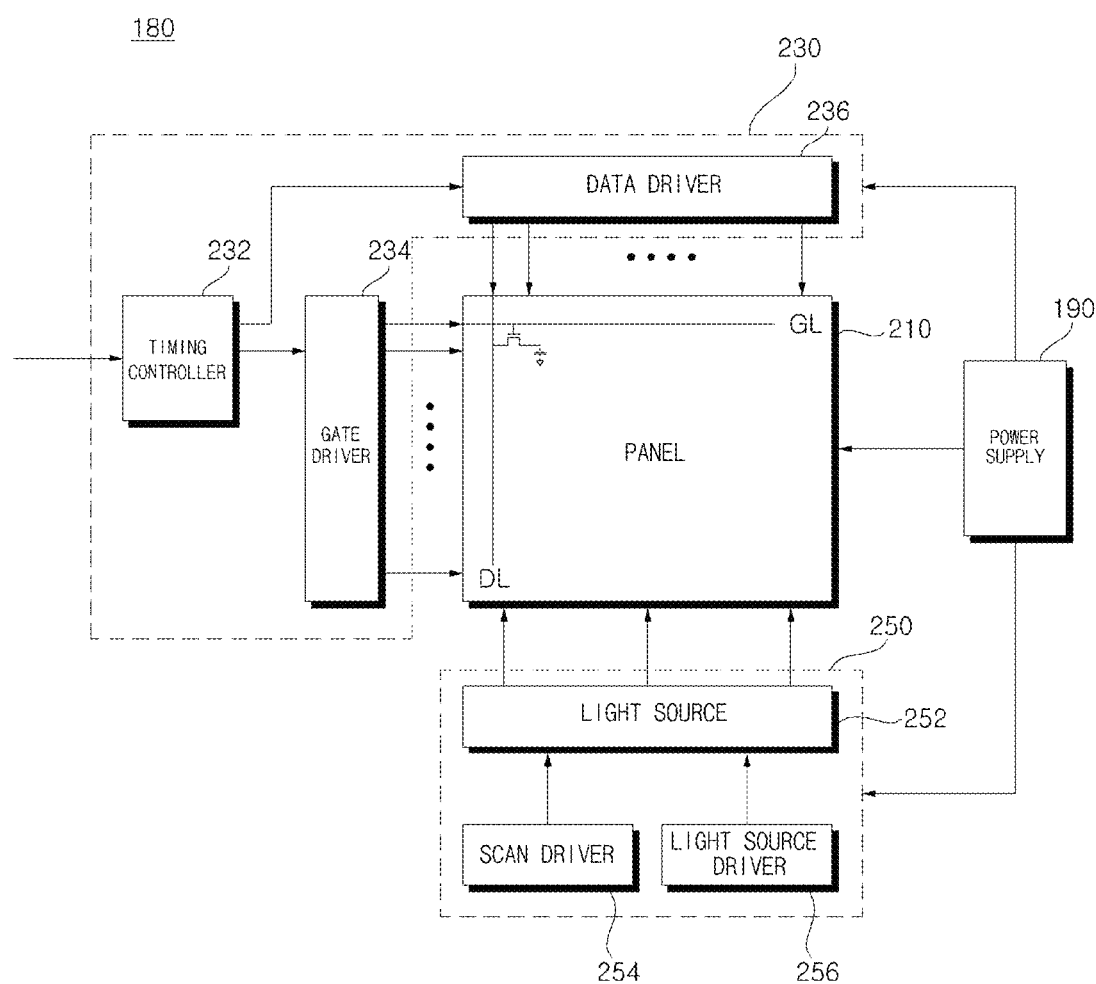
FIG. 5 illustrates one example of an internal structure of the display of FIG. 2.
Figure 5B:
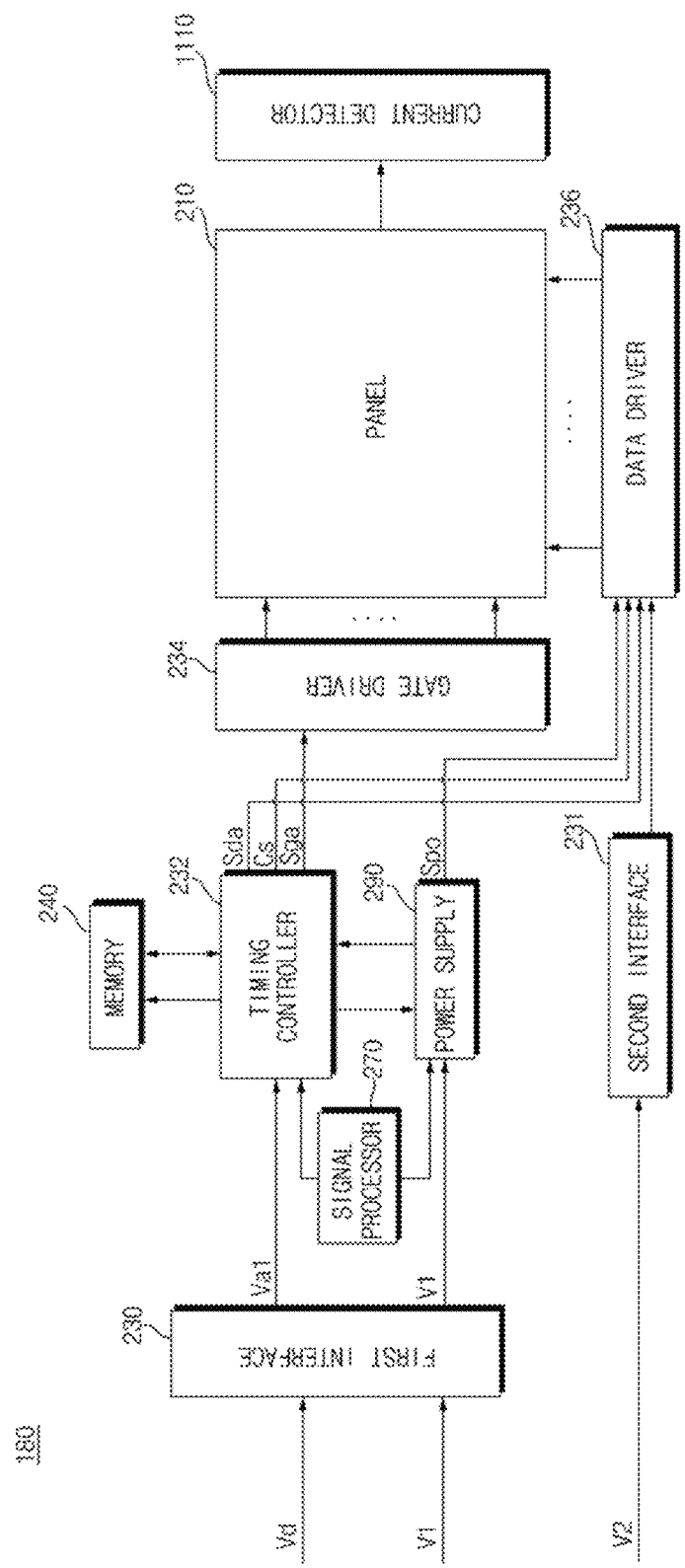

FIG. 5 illustrates one example of an internal structure of the display of FIG. 2.

Referring to the figure, a display 180 based on the liquid crystal display (LCD) panel may include a liquid crystal display panel 210, a driving circuit 230, and a backlight 250.

The liquid crystal display panel 210, to display an image, includes a first panel in which a plurality of gate lines GL and data lines DL are arranged to cross each other in a matrix form, and the cross area includes thin film transistors (e.g., switching elements) and pixel electrodes connected to the transistors, a second panel including a common electrode, and a liquid crystal layer formed between the first panel and the second panel.

Meanwhile, the first panel, the second panel, and the liquid crystal layer may be referred to collectively as the TFT panel.

On the other hand, the liquid crystal panel 210, in the TFT panel, according to the turn-on (e.g., turn-on level or turn-on time) of the thin film transistor (e.g., the switching element), may adjust the amount of penetration of light from the backlight 250.

Meanwhile, the liquid crystal panel 210 may include a color filter (CFL) that filters light output from the TFT panel for each color.

The driving circuit 230 drives the liquid crystal panel 210 through a control signal and a data signal supplied from the controller 170 of FIG. 1. To this end, the driving circuit 230 includes a timing controller 232, a gate driver 234, and a data driver 236.

The timing controller 232 receives a control signal and R, G, B data signals, a vertical synchronization signal (Vsync), and so on from the controller 170, controls the gate driver 234 and the data driver 236 in response to the control signal, rearranges the R, G, B data signals, and provides the rearranged R, G, B data signals to the data driver 236.

Scan and image signals are transmitted to the liquid crystal panel 210 through the gate line GL and the data line DL according to the control of the gate driver 234, the data driver 236, and the timing controller 232.

The backlight 250 supplies light to the liquid crystal panel 210. To this end, the backlight 250 may include a light source 252 comprising a plurality of light sources, a scan driver 254 controlling scan driving of the light source 252, and a light source driver 256 that turns on/off the light source 252.

A predetermined image is displayed using the light emitted from the backlight 250, with the light penetration rate of the liquid crystal layer having been adjusted by the electric field formed between the pixel electrode and the common electrode of the liquid crystal panel 210.

The power supply 190 may supply a common electrode voltage Vcom to the LCD panel 210 and supply a gamma voltage to the data driver 236. Also, driving power for driving the light source 252 may be supplied to the backlight 250.

Figure 6:
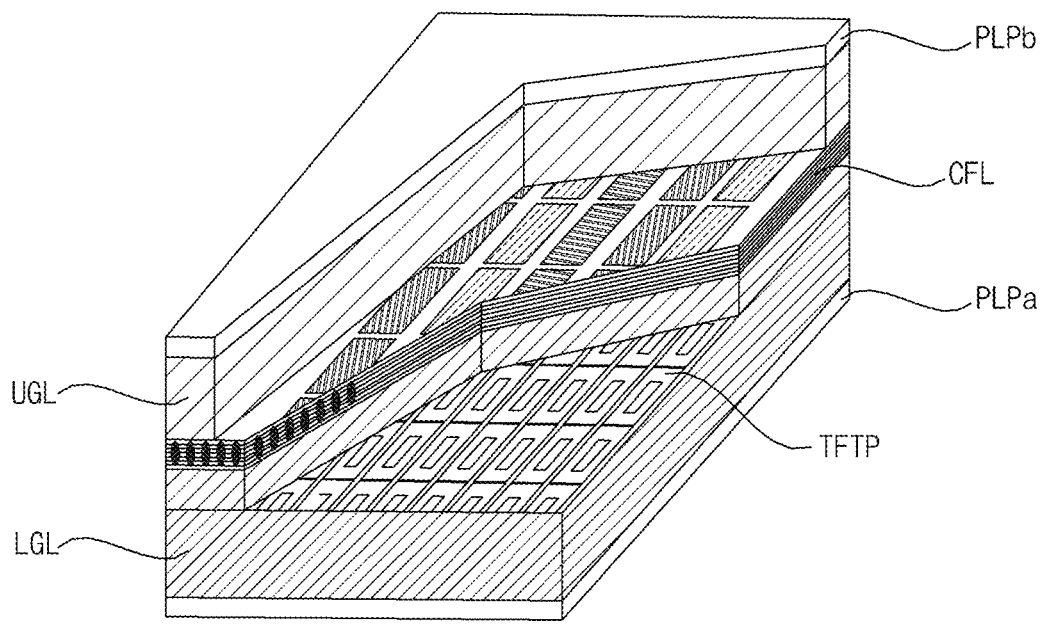
FIG. 6 is a partial cutaway view of the liquid crystal panel of FIG. 5.

FIG. 6 is a partial cutaway view of the liquid crystal panel of FIG. 5.

Referring to the figure, the liquid crystal panel 210, from the bottom to the top, may include a first polarizing plate PLPa, a lower glass LGL, a TFT panel TFTP, a color filter CFL, an upper glass UGL, and a second polarizing plate PLPb.

Meanwhile, the TFT panel TFTP may include a first panel in which a plurality of gate lines GL and data lines DL are arranged to cross each other in a matrix form, and the cross area includes thin film transistors (e.g., switching elements) and pixel electrodes connected to the transistors, a second panel including a common electrode, and a liquid crystal layer formed between the first panel and the second panel.

Based on the turn-on of switching elements in the TFT panel TFTP, the amount of penetration of light from the backlight 250 may be adjusted.

The color filter CFL may filter the light output from the TFT panel TFTP for each color. For example, when the light output from the TFT panel TFTP is white light, the light may be split into red, green, and blue light after passing through the color filter CFL.

Meanwhile, although turning on the switching elements in the TFT panel TFTP of FIG. 6 adjusts the amount of light transmission, the luminance expression power, for example, the dynamic range of luminance, may be limited.

Therefore, the present disclosure, using two TFT panels, implements the dynamic range of luminance in more detail based on the turn-on of switching elements in each TFT panel. In other words, the present disclosure proposes a method for improving luminance expression power. The proposed method will be described with reference to FIG. 7 and subsequent drawings.

Figure 7:
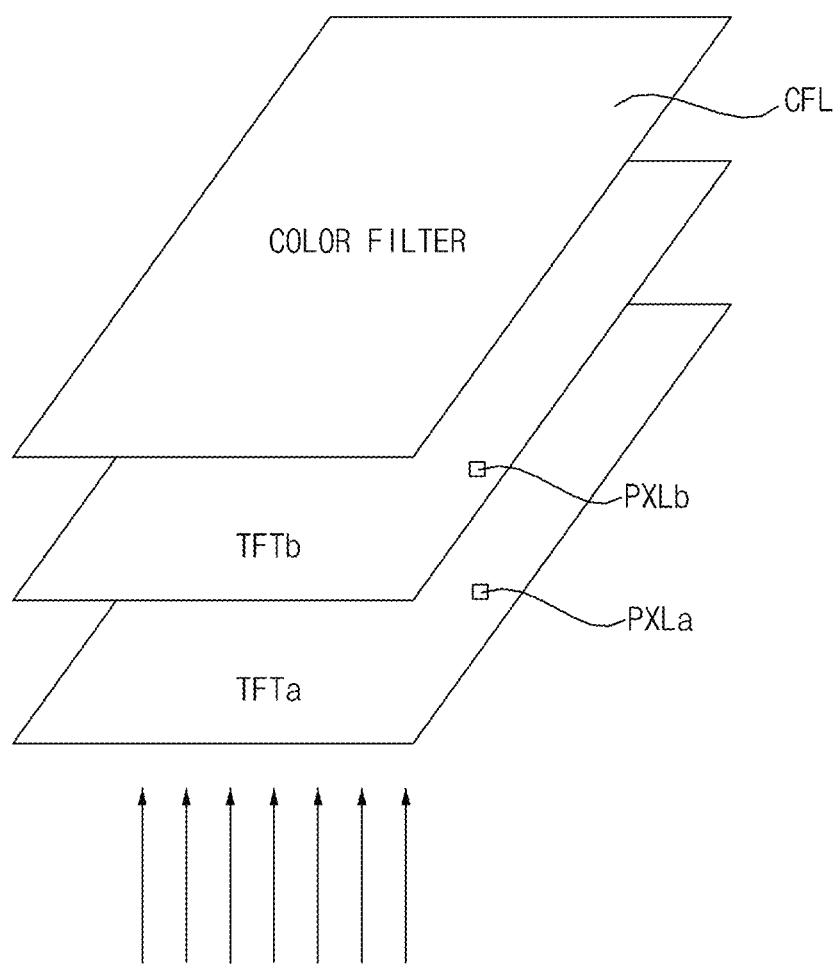
FIG. 7 is a simplified structure of a display device according to an embodiment of the present disclosure.
Figure 8:
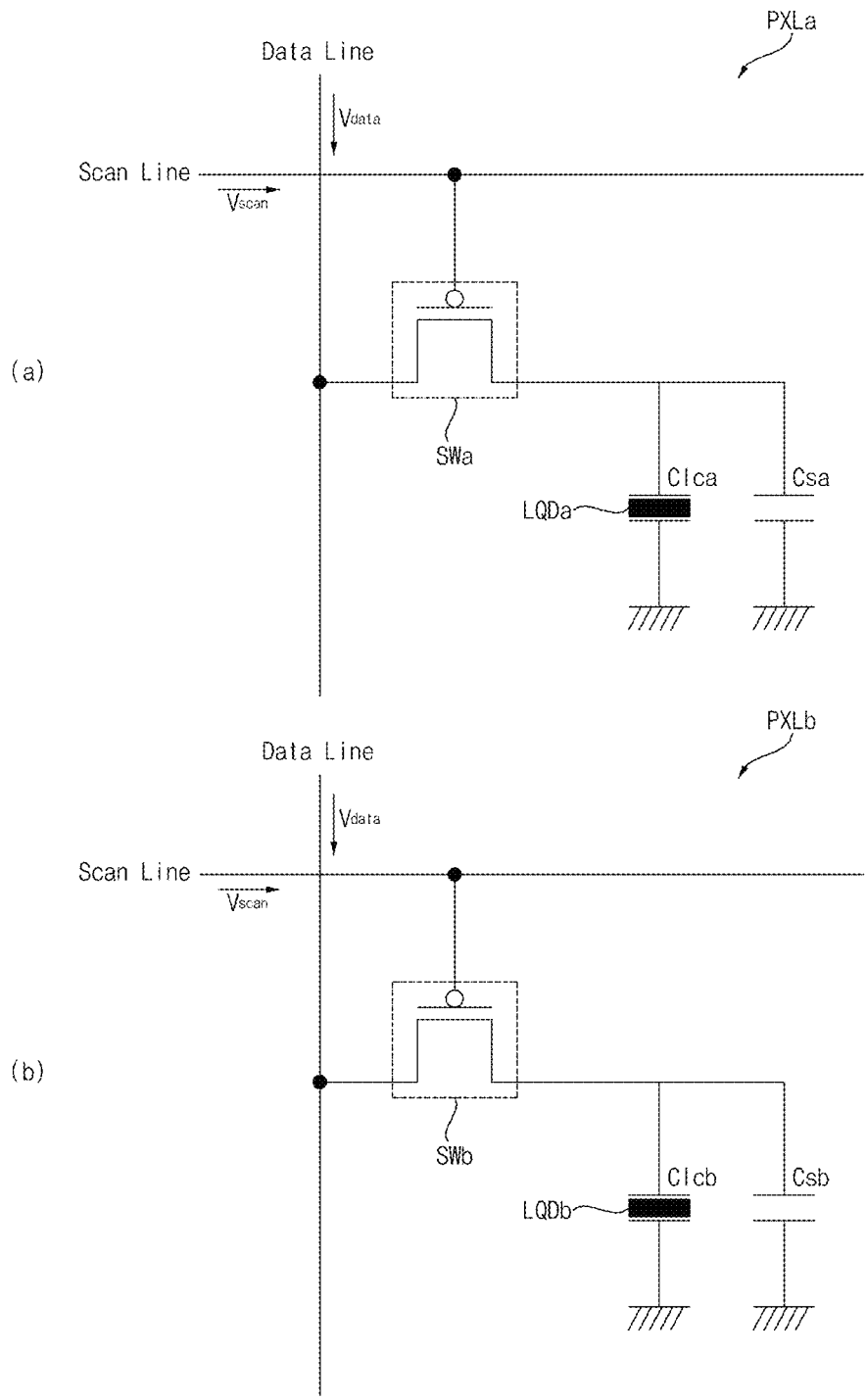

FIG. 7 is a simplified structure of a display device according to an embodiment of the present disclosure, and FIGS. 8 to 11E are diagrams referred to in the description of FIG. 7.

First, referring to FIG. 7, a display device 800 according to one embodiment of the present disclosure comprises a backlight 250, a first TFT panel TFTa having a plurality of switching elements and configured to control the amount of light penetration of the backlight 250 for the respective areas corresponding to the plurality of switching elements, a second TFT panel TFTb having a plurality of switching elements and configured to control the amount of penetration of light output from the first TFT panel TFTa for the respective areas corresponding to the plurality of switching elements, and a color filter CFL filtering the light output from the second TFT panel TFTb for each color.

Although the backlight 250 is not shown in the figure, the light incident on the first TFT panel TFTa corresponds to the light output from the backlight 250 of FIG. 5A.

FIG. 8(a) illustrates a first pixel PXLa circuit of the first TFT panel TFTa, and FIG. 8(b) illustrates a second pixel PXLb circuit of the second TFT panel TFTb.

First, referring to FIG. 8A, the first pixel PXLa circuit may include a first switching element SWa, a storage capacitor Csa, and a liquid crystal layer LQDa. Meanwhile, the liquid crystal layer LQDa may be expressed by a capacitor Clca on the circuit.

The first switching element SWa has a scan line connected to a gate terminal and is turned on according to an input scan signal Vdscan.

When the first switching element SWa is turned on, an input data signal Vdata is transferred to one end of the storage capacitor Csa or one end of the capacitor Clca.

The storage capacitor Csa is disposed between the first switching element SWa and the ground terminal and stores a data signal level transferred to one end of the storage capacitor Csa.

For example, when the data signal has a different level according to a Pulse Amplitude Modulation (PAM) method, the power level stored in the storage capacitor Csa varies according to the level difference of the data signal Vdata.

For another example, when the data signal has a different pulse width according to a Pulse Width Modulation (PWM) method, the power level stored in the storage capacitor Csa varies according to the pulse width difference of the data signal Vdata.

Meanwhile, in the liquid crystal layer LDQa, the movement of the liquid crystal varies according to the power level stored in the storage capacitor Csa, and the amount of light penetration is adjusted according to the degree of movement of the liquid crystal.

Meanwhile, the first pixel PXLa is a hold-type element through which light is continuously transmitted from the liquid crystal layer LQDa after a scan signal is applied during a unit display period, specifically during a unit frame.

In the case of the hold-type device, the turn-on time of the first switching element SWa varies according to the power level or time applied to the first switching element SWa, and accordingly, the amount of penetration of light from the liquid crystal layer LQDa may be varied.

Next, referring to FIG. 8(b), the second pixel PXLb circuit may include a second switching element SWb, a storage capacitor Csb, and a liquid crystal layer LQDb. Meanwhile, the liquid crystal layer LQDb may be expressed by a capacitor Clcb on the circuit.

The second switching element SWb has a scan line connected to a gate terminal and is turned on according to an input scan signal Vdscan.

When the second switching element SWb is turned on, an input data signal Vdatb is transferred to one end of the storage capacitor Csb or one end of the capacitor Clcb.

The storage capacitor Csb is disposed between the second switching element SWb and the ground terminal and stores a data signal level transferred to one end of the storage capacitor Csb.

For example, when the data signal has a different level according to a Pulse Amplitude Modulation (PAM) method, the power level stored in the storage capacitor Csb varies according to the level difference of the data signal Vdatb.

For another example, when the data signal has a different pulse width according to a Pulse Width Modulation (PWM)

method, the power level stored in the storage capacitor Csb varies according to the pulse width difference of the data signal Vdatb.

Meanwhile, in the liquid crystal layer LDQb, the movement of the liquid crystal varies according to the power level stored in the storage capacitor Csb, and the amount of light penetration is adjusted according to the degree of movement of the liquid crystal.

Meanwhile, the second pixel PXLb is a hold-type element through which light is continuously transmitted from the liquid crystal layer LQDb after a scan signal is applied during a unit display period, specifically during a unit frame.

Meanwhile, to improve luminance expression power, it is preferable that a voltage applied during the turn-on period or at the turn-on time of the first switching element SWa within the first pixel PXLa of the first TFT panel TFTa corresponding to a first area within the display device 800 and a voltage applied to the turn-on period or at the turn-on time of the second switching element SWb within the second TFT panel TFTb corresponding to the first area within the display device 800 have some difference in voltage level.

Accordingly, compared to the case in which the voltage level applied during the turn-on period or at the turn-on time of the first switching element SWa within the first pixel PXLa of the first TFT panel TFTa is the same as the voltage level applied during the turn-on period or at the turn-on time of the second switching element SWb within the second TFT panel TFTb, diversity may be obtained for luminance expression; as a result, the dynamic range of luminance may be improved.

Meanwhile, to improve luminance expression power, the present disclosure may control the first switching element SWa within the first pixel PXLa of the first TFT panel TFTa and the second switching element SWb within the second TFT panel TFTb to perform over-driving in response to an object CAR within an image frame data input to the display device 800.

In other words, while a first voltage V1 is applied to the first switching element SWa within the first pixel PXLa of the first TFT panel TFTa, a second voltage V2 higher than the first voltage V1 is applied to the first switching element SWa within the first pixel PXLa of the first TFT panel TFTa in response to an object CAR within an image frame data input to the display device 800; while a third voltage V3 is applied to a second switching element SWb within the second pixel PXLb of the second TFT panel TFTb, a fourth voltage V4 higher than the third voltage V3 is applied to the second switching element SWb within the second pixel PXLb of the second TFT panel TFTb in response to the object CAR within the image frame data input to the display device 800; and when the object CAR within the image frame data input to the display device 800 moves, a fifth voltage V5 higher than the second voltage V2 is applied to the first switching element SWa of the first TFT panel TFTa, and a sixth voltage V6 higher than the fourth voltage V4 is applied to the second switching element SWb within the second pixel PXLb of the second TFT panel TFTb.

As described above, by controlling the amount of over-driving of the first switching element SWa within the first pixel PXLa of the first TFT panel TFTa to differ from the amount of over-driving of the second switching element SWb within the second TFT panel TFTb, luminance expression power is further improved.

In particular, compared to the case in which the amount of over-driving of the first switching element SWa within the first pixel PXLa of the first TFT panel TFTa is the same as the amount of over-driving of the second switching element SWb within the second TFT panel TFTb, diversity may be obtained for luminance expression; as a result, the luminance expression power is further improved.

Meanwhile, when the object CAR within the image frame data input to the display device 800 moves, the fifth voltage V5 higher than the second voltage V2 is applied to the first switching element SWa within the first pixel PXLa of the first TFT panel TFTa; after the fifth voltage V5 is applied, the second voltage V2 is applied; the sixth voltage V6 higher than the fourth voltage V4 is applied to the second switching element SWb within the second pixel PXLb of the second TFT panel TFTb; after the sixth voltage V6 is applied, the fourth voltage V4 is applied. Accordingly, in response to the movement of the object CAR, luminance expression power in the display device may be improved.

Figure 9A:
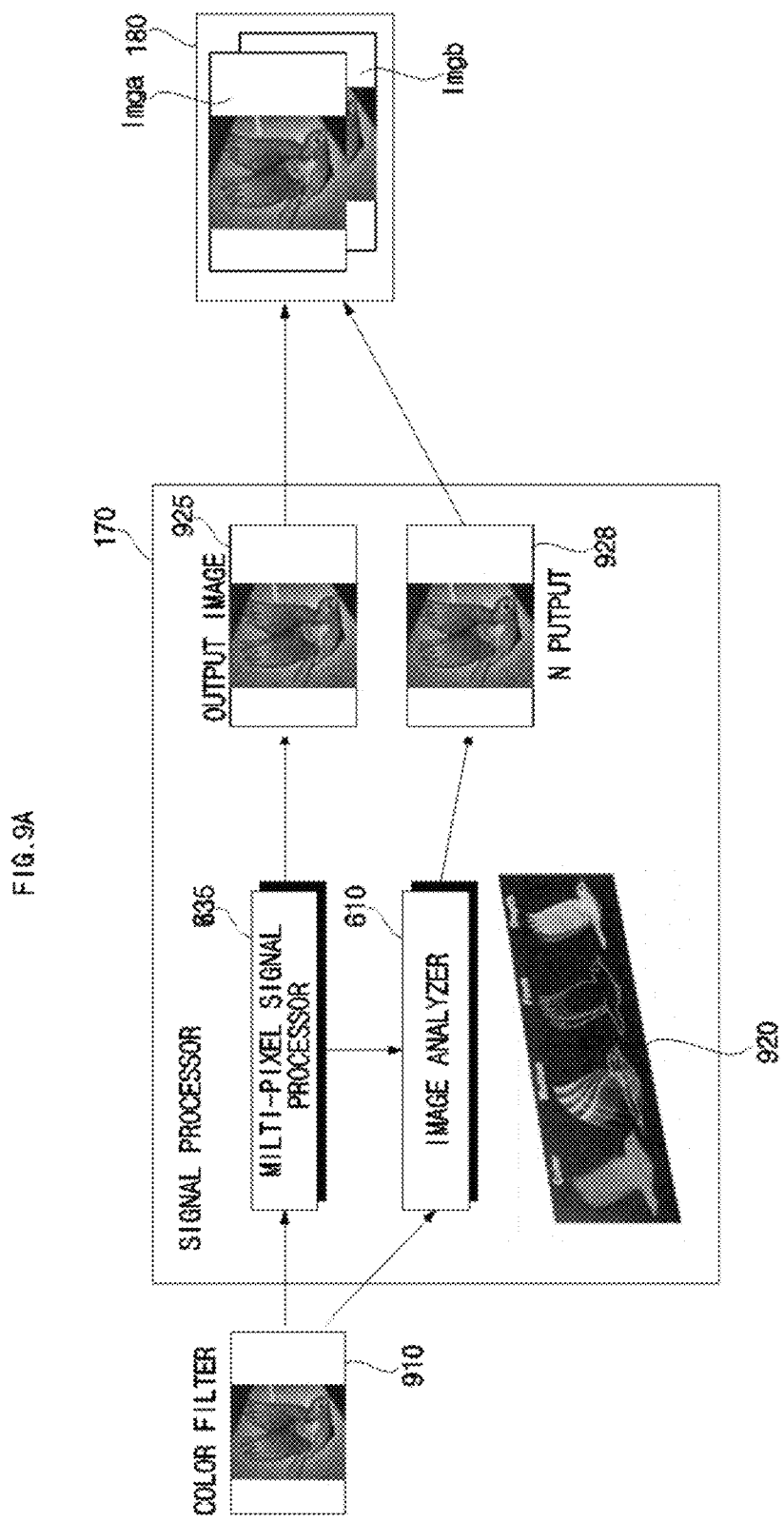

FIG. 9A illustrates one example of an internal block diagram of the signal processor 170 according to an embodiment of the present disclosure.

Referring to the figure, the signal processor 170 according to an embodiment of the present disclosure may receive an input image 910, process the input image, and output image frame data.

At this time, as in the display 800 of FIG. 7, when the display 180 includes a first TFT panel TFTa, a second TFT panel TFTb, and a color filter CFL, the signal processor 170 may output a first image frame data Imga 925 for driving switching elements of the first TFT panel TFTa and a second image frame data Imgb 928 for driving switching elements of the second TFT panel TFTb.

To this end, the signal processor 170 may include an image analyzer 610 that analyzes the input image 910 and a multi-pixel signal processor 735 for driving multiple pixels based on the analyzed image information.

At this time, the image analyzer 610 may analyze a resolution, a grayscale, a noise level, a pattern, and the like and output information related to the analyzed input image signal, particularly image quality settings information.

The multi-pixel signal processor 735 may perform at least one of dynamic range adjustment, contrast adjustment, color adjustment, and over-drive adjustment to drive the first pixel of the first TFT panel TFTa and the second pixel of the second TFT panel TFTb.

In particular, the multi-pixel signal processor 735 may perform at least one of adaptive adjustment of dynamic range, adaptive adjustment of contrast, adaptive adjustment of color, and adaptive adjustment of over-drive to drive the first pixel of the first TFT panel TFTa and the second pixel of the second TFT panel TFTb.

Specifically, the multi-pixel signal processor 735 may control to perform at least one of adaptive adjustment of dynamic range, adaptive adjustment of contrast, adaptive adjustment of color, and adaptive adjustment of over-drive based on the movement or depth of an object of the first image frame data Imga and the second image frame data Imgb.

For example, the multi-pixel signal processor 735 may control to perform adaptive adjustment of dynamic range on the object CAR of first image frame data Imga and the second image frame data Imgb based on the overall luminance of the input image and the luminance of the object CAR within the input image.

As the difference between the overall luminance of the input image and the luminance of the object CAR within the input image increases, the multi-pixel signal processor 735 may control to increase the dynamic range of the object CAR of the first image frame data Imga and the second image frame data Imgb.

Meanwhile, as the difference between the overall luminance of the input image and the luminance of the object CAR within the input image increases, the multi-pixel signal processor 735 may control to increase the contrast of the object CAR of the first image frame data Imga and the second image frame data Imgb.

Meanwhile, as the difference between the overall luminance of the input image and the luminance of the object CAR within the input image increases, the multi-pixel signal processor 735 may control to increase the color enhancement of the first image frame data Imga and the second image frame data Imgb.

In another example, the multi-pixel signal processor 735 may control to perform adaptive adjustment of dynamic range on the object CAR of first image frame data Imga and the second image frame data Imgb based on the amount of the movement of the object CAR within the input image.

As the amount of the movement of the object CAR within the input image increases, the multi-pixel signal processor 735 may control to increase the dynamic range of the object CAR of the first image frame data Imga and the second image frame data Imgb.

Meanwhile, as the amount of the movement of the object CAR within the input image increases, the multi-pixel signal processor 735 may control to increase the contrast of the object CAR of the first image frame data Imga and the second image frame data Imgb.

Meanwhile, as the amount of the movement of the object CAR within the input image increases, the multi-pixel signal processor 735 may control to increase the color enhancement of the first image frame data Imga and the second image frame data Imgb.

Figure 9B:
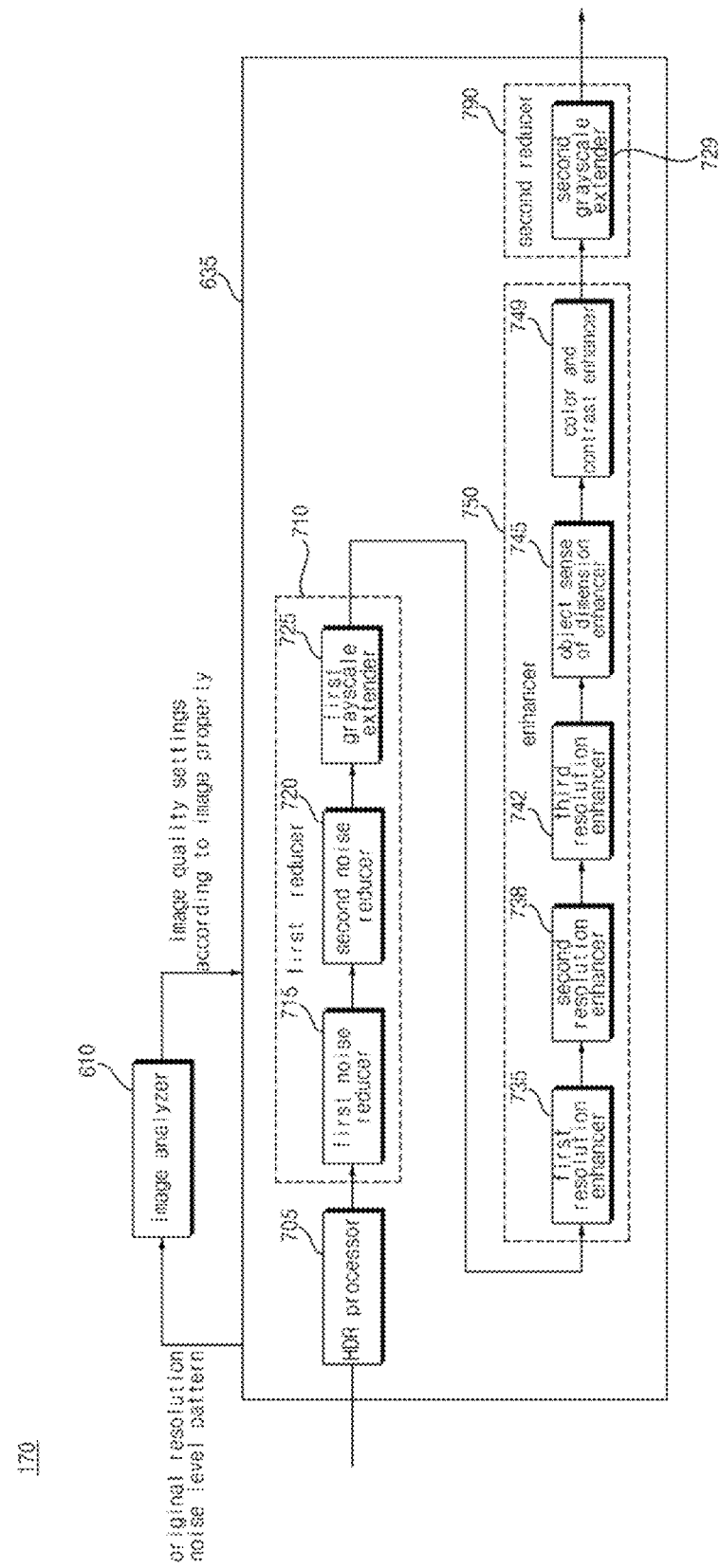

FIG. 9B illustrates another example of the signal processor 170 according to an embodiment of the present disclosure.

Referring to the figure, the signal processor 170 according to an embodiment of the present disclosure may include an image analyzer 610 and an image quality processor 635.

The image analyzer 610 may analyze an input image signal and output information related to the analyzed input image signal.

Meanwhile, the image analyzer 610 may distinguish an object region and a background region of a first input image signal which is input. Alternatively, the image analyzer 610 may calculate a probability or a ratio of the object region and the background region of the first input image signal which is input.

The input image signal may be an input image signal from the image receiver 105 or an image decoded in the image decoder 320.

Particularly, the image analyzer 610 may analyze the input image signal by using artificial intelligence (AI) and output the analyzed input image signal information.

Specifically, the image analyzer 610 may analyze a resolution, a grayscale, a noise level, a pattern, and the like and output information related to the analyzed input image signal, particularly image quality settings information to the image quality processor 635.

The image quality processor 635 may include an HDR processor 705, a first reducer 710, an enhancer 750, and a second reducer 790.

The HDR processor 705 may receive an image signal input and process a high dynamic range (HDR) processing with respect to the input image signal.

For example, the HDR processor 705 may convert a standard dynamic range (SDR) image signal to an HDR image signal.

For another example, the HDR processor 705 may receive an image signal input and process a resolution of grayscale for a high dynamic range (HDR) with respect to the input image signal.

Meanwhile, in the case that an input image signal is an SDR image signal, the HDR processor 705 may bypass a grayscale conversion, and in the case that an input image signal is an HDR image signal, the HDR processor 705 may perform a grayscale conversion. Accordingly, for an input image, the high grayscale expressiveness may be improved.

The HDR processor 705 may perform a grayscale conversion based on a first grayscale conversion mode in which a low grayscale is enhanced between the low gray scale and the high gray scale and a high grayscale is saturated or a second grayscale conversion mode in which the low gray scale and the high gray scale are entirely and uniformly converted.

Particularly, in the case that the first grayscale conversion mode is performed, the HDR processor 705 may perform a grayscale conversion based on the data that corresponds to the first grayscale conversion mode in a look-up table.

More particularly, in the case that the first grayscale conversion mode is performed, the HDR processor 705 may perform a grayscale conversion based on a calculation expression for input data and the data that corresponds to the first grayscale conversion mode in a look-up table which is determined by the calculation expression. Here, the input data may include video data and meta data.

Meanwhile, in the case that the second grayscale conversion mode is performed, the HDR processor 705 may perform a grayscale conversion based on the data that corresponds to the second grayscale conversion mode in a look-up table.

More particularly, in the case that the second grayscale conversion mode is performed, the HDR processor 705 may perform a grayscale conversion based on a calculation expression for input data and the data that corresponds to the second grayscale conversion mode in a look-up table which is determined by the calculation expression. Here, the input data may include video data and meta data.

Meanwhile, the HDR processor 705 may select the first grayscale conversion mode or the second grayscale conversion mode according to a third grayscale conversion mode or a fourth grayscale conversion mode in a high grayscale amplifier 851 in the second reducer 790.

For example, in the case that the third grayscale conversion mode is performed, the high grayscale amplifier 851 in the second reducer 790 may perform a grayscale conversion based on the data that corresponds to the third grayscale conversion mode in a look-up table.

Particularly, in the case that the third grayscale conversion mode is performed, the high grayscale amplifier 851 in the second reducer 790 may perform a grayscale conversion based on a calculation expression for input data and the data that corresponds to the third grayscale conversion mode in a look-up table which is determined by the calculation expression. Here, the input data may include video data and meta data.

Meanwhile, in the case that the fourth grayscale conversion mode is performed, the high grayscale amplifier 851 in the second reducer 790 may perform a grayscale conversion based on the data that corresponds to the fourth grayscale conversion mode in a look-up table.

Particularly, in the case that the fourth grayscale conversion mode is performed, the high grayscale amplifier 851 in the second reducer 790 may perform a grayscale conversion based on a calculation expression for input data and the data that corresponds to the fourth grayscale conversion mode in a look-up table which is determined by the calculation expression. Here, the input data may include video data and meta data.

For example, in the case that the fourth grayscale conversion mode is performed in the high grayscale amplifier 851 in the second reducer 790, the HDR processor 705 may perform the second grayscale conversion mode.

In another example, in the case that the third grayscale conversion mode is performed in the high grayscale amplifier 851 in the second reducer 790, the HDR processor 705 may perform the first grayscale conversion mode.

Alternatively, the high grayscale amplifier 851 in the second reducer 790 may vary the grayscale conversion mode, which is performed, according to the grayscale conversion mode in the HDR processor 705.

For example, in the case that the second grayscale conversion mode is performed in the HDR processor 705, the high grayscale amplifier 851 in the second reducer 790 may perform the fourth grayscale conversion mode.

In another example, in the case that the first grayscale conversion mode is performed in the HDR processor 705, the high grayscale amplifier 851 in the second reducer 790 may perform the third grayscale conversion mode.

The HDR processor 705 according to an embodiment of the present disclosure may perform the grayscale conversion mode such that a low grayscale and a high grayscale are uniformly converted.

Meanwhile, the second reducer 790 may perform the fourth grayscale conversion mode according to the second grayscale conversion mode in the HDR processor 705, and accordingly, may amplify an upper limit level of the grayscale of the input image signal. Accordingly, for an input image, the high grayscale expressiveness may be improved.

The first reducer 710 may perform a noise reduction for an input image signal or an image signal performed in the HDR processor 705.

Particularly, the first reducer 710 may perform the multi-stage noise reduction process and a first stage grayscale extension process for an input image signal or an HDR image from the HDR processor 705.

For this, the first reducer 710 may include a plurality of noise reducers 715 and 720 for the multi-stage noise reduction and a grayscale extender 725 for the grayscale extension.

The enhancer 750 may perform the multi-stage image resolution enhancement process for the image from the first reducer 710.

In addition, the enhancer 750 may perform the object sense of dimension enhancement process. Furthermore, the enhancer 750 may perform the color or contrast enhancement process.

For this, the enhancer 750 may include a plurality of resolution enhancers 735, 738, and 742 for the image resolution enhancement in multi-stage, an object sense of dimension enhancer 745 for the object sense of dimension enhancement, and a color and contrast enhancer 749 for the color or contrast enhancement.

The second reducer 790 may perform a two-stage grayscale extension process based on the image signal in which the noise input from the first reducer 710 is removed.

The second reducer 790 may amplify an upper limit level of the grayscale of an input signal and may extend a resolution of high grayscale of the input signal. Accordingly, for an input image, the high grayscale expressiveness may be improved.

For example, the second reducer 790 may perform a grayscale extension uniformly throughout the entire grayscale regions of an input signal. Accordingly, the uniform grayscale extension may be performed for the regions of the input image, and the high grayscale expressiveness may be improved.

The second reducer 790 may perform the grayscale amplification and extension based on the input signal from the first grayscale extender 725. Accordingly, for an input image, the high grayscale expressiveness may be improved.

In the case that an input image signal is an SDR image signal, the second reducer 790 may vary a degree of amplification based on a user input signal. Accordingly, in response to a user settings, the high grayscale expressiveness may be improved.

Meanwhile, in the case that an input image signal is an HDR image signal, the second reducer 790 may perform amplification according to a settings value. Accordingly, for an input image, the high grayscale expressiveness may be improved.

In the case that an input image signal is an HDR image signal, the second reducer 790 may vary a degree of amplification based on a user input signal. Accordingly, in response to user settings, the high grayscale expressiveness may be improved.

Meanwhile, the second reducer 790 may vary a degree of grayscale extension in performing the grayscale extension based on a user input signal. Accordingly, in response to a user settings, the high grayscale expressiveness may be improved.

The second reducer 790 may amplify an upper limit level of the grayscale according to the grayscale conversion mode in the HDR processor 705. Accordingly, for an input image, the high grayscale expressiveness may be improved.

The signal processing device 170 includes the HDR processor 705 for receiving an image signal input and adjusting contrast of the input image signal and the reducer 790 for amplifying the contrast of the image signal from the HDR processor 705 and generating an enhanced image signal by increasing the grayscale resolution of the image signal. The enhanced image signal provides the enhanced contrast and the grayscale resolution of the image signal while high dynamic range in a displayed HDR image is maintained.

The contrast range of the image signal is controlled by a control signal received from the signal processing device 170.

Meanwhile, the image analyzer may be further included, which determines whether an input image signal is an HDR signal or an SDR signal and generates a control signal to be provided to the HDR processor 705. The control signal controls the HDR processor 705 only in the case that the input image signal is the HDR signal.

The control signal is received from the controller of the image display apparatus associated with the signal processing and corresponds to the settings of the image display apparatus.

Meanwhile, the resolution of grayscale is increased based on the amplification of the controlled contrast of the image signal.

The resolution of grayscale is increased based on the control signal input to the signal processing device 170.

The control signal is received from the controller of the image display apparatus associated with the signal processing and corresponds to the settings of the image display apparatus.

Meanwhile, the reducer 790 may include the high grayscale amplifier 851 for amplifying an upper limit level of the grayscale of an input signal and de-contourers 842 and 844 for extending a resolution of the grayscale which is amplified from the high grayscale amplifier 851.

The second reducer 790 may include a second grayscale extender 729 for a two-stage grayscale extension.

Meanwhile, the image quality processor 635 in the signal processing device 170 according to the present disclosure performs a four-stage reduction process and a four-stage image enhancement process as shown in FIG. 10.

Here, the four-stage reduction process may include a two-stage noise reduction process and a two-stage grayscale extension process.

The two-stage noise reduction process may be performed by the first and second noise reducers 715 and 720 in the first reducer 710, and the two-stage grayscale extension process may be performed by the first grayscale extender 725 in the first reducer 710 and the second grayscale extender 725 in the second reducer 790.

Meanwhile, the four-stage image enhancement process may include a three-stage image resolution (bit resolution) enhancement process and the object sense of dimension enhancement process.

Here, the three-stage image resolution process is performed by the first to third resolution enhancers 735, 738, and 742, and the object sense of dimension enhancement process may be performed by the object sense of dimension enhancer 745.

The signal processing device 170 according to the present disclosure may enhance the image quality gradually by applying the same or similar algorithm as the multi-stage image quality process.

For this, the image quality processor 635 in the signal processing device 170 according to the present disclosure may apply the same or similar algorithm two times or more and perform the image quality enhancement process.

The same or similar algorithm performed in the image quality processor 635 has different objects to attain in the respective stages and has an advantage that smaller artifact occurs by performing the multi-stage image quality enhancement process gradually in comparison with the single-stage image quality enhancement process, and has an advantage that more natural and fine image process result may be obtained.

In addition, the same or similar algorithm is alternately applied with the other image quality processing algorithm in multi-stage, and there is an effect of more than simple consecutive processing stages.

The signal processing device 170 according to the present disclosure may perform the noise reduction process in a multi-stage manner. The noise reduction process in each stage may include a temporal process and a spatial process.

To calculate the original image quality of an image signal, in the present disclosure, the latest technology such as the artificial intelligence may be used. To this end, a deep neural network may be used.

Meanwhile, the image quality processor 536 of FIG. 9B may output the first image frame data Imga and the second image frame data Imgb.

FIG. 10A(a) shows an object CAR within the input image 1010, and FIG. 10A(b) illustrates a case in which the object CAR within the input image 1015 moves by La.

FIG. 10B illustrates a method for driving the first switching element SWa within the first pixel PXLa of the first TFT panel TFTa in response to the input image of FIG. 10A.

First, as shown in FIG. 10B(a), while the first voltage V1 is applied to the first switching element SWa within the first pixel PXLa of the first TFT panel TFTa, the second voltage V2 higher than the first voltage V1 is applied to the first switching element SWa within the first pixel PXLa of the first TFT panel TFTa at the time of Tm in response to the object CAR within the image frame data.

The response speed L of the liquid crystal within the first pixel PXLa varies according to the applied voltage V.

As shown in the figure, when the second voltage V2 higher than the first voltage V1 is applied instantaneously at time T while the first voltage V1 is applied during a predetermined frame, because of the slow response speed of the liquid crystal, a transition period such as the first period T1 shown in the figure appears rather than responding immediately to the second voltage V2. The transition period becomes longer as the difference Vd1 between the first voltage V1 and the second voltage V2 increases.

Accordingly, a motion blurring phenomenon occurs, in which the screen becomes blurry when a moving picture is displayed.

To prevent the motion blurring, an embodiment of the present disclosure applies over-driving, as shown in FIG. 10B(b).

In other words, as shown in FIG. 10B(b), in response to the object CAR within the image frame data, at time Tm, the fifth voltage V5 higher than the second voltage V2 and higher than the first voltage V1 is applied to the first switching element SWa within the first pixel PXLa of the first TFT panel TFTa; and the second voltage V2 is applied again at time Tm2.

The figure shows that the transition period is shortened to the second period T2, which is a period significantly reduced compared to the first period T1 of FIG. 10B(a).

To shorten the transition period, it is preferable to further increase the level of the fifth voltage V5. In other words, as the difference Vd2 between the second voltage V2 and the fifth voltage V5 increases, the transition period becomes shorter. Accordingly, the luminance expression power of the first pixel PXLa of the first TFT panel TFTa is improved.

FIG. 10C illustrates a method for driving the second switching element SWb within the second pixel PXLb of the second TFT panel TFTb in response to the input image of FIG. 10A.

First, as shown in FIG. 10C(a), while the third voltage V3 is applied to the second switching element SWb within the second pixel PXLb of the second TFT panel TFTb, the fourth voltage V4 higher than the third voltage V3 is applied to the second switching element SWb within the second pixel PXLb of the second TFT panel TFTb at the time of Tm in response to the object CAR within the image frame data.

The response speed L of the liquid crystal within the second pixel PXLb varies according to the applied voltage V. Meanwhile, as shown in the figure, a transition period such as the first period T1 appears.

Accordingly, a motion blurring phenomenon occurs, in which the screen becomes blurry when a moving picture is displayed.

To prevent the motion blurring, an embodiment of the present disclosure applies over-driving, as shown in FIG. 10C(b).

In other words, as shown in FIG. 10C(b), in response to the object CAR within the image frame data, at time Tm, the sixth voltage V6 higher than the fourth voltage V4 and higher than the third voltage V3 is applied to the second switching element SWb within the second pixel PXLb of the second TFT panel TFTb; and the fourth voltage V4 is applied again at time Tm2.

The figure shows that the transition period is shortened to the second period T2, which is a period significantly reduced compared to the first period T1 of FIG. 10C(a).

To shorten the transition period, it is preferable to further increase the level of the sixth voltage V6. In other words, as the difference Vd2 between the fourth voltage V4 and the sixth voltage V6 increases, the transition period becomes shorter. Accordingly, the luminance expression power of the second pixel PXLb of the second TFT panel TFTb is improved.

Meanwhile, when the object CAR within the image frame data input to the display device 800 moves, it is preferable that the fifth voltage V5 higher than the second voltage V2 is applied to the first switching element SWa within the first pixel PXLa of the first TFT panel TFTa, as shown in FIG. 10B; after the fifth voltage V5 is applied, the second voltage V2 is applied; as shown in FIG. 10C, the sixth voltage V6 higher than the fourth voltage V4 is applied to the second switching element SWb within the second pixel PXLb of the second TFT panel TFTb; after the sixth voltage V6 is applied, the fourth voltage V4 is applied. Accordingly, in response to the movement of the object CAR, luminance expression power in the display device may be improved.

On the other hand, when the display device 800 is in the dynamic range mode, it is preferable that the second voltage V2 and the fourth voltage V4 are different, and the fifth voltage V5 and the sixth voltage V6 are different. Accordingly, based on the dynamic range mode, luminance expression power in the display device may be increased.

Meanwhile, when the display device 800 is not in the dynamic range mode, it is preferable that the second voltage V2 is the same as the fourth voltage V4, and the fifth voltage V5 is the same as the sixth voltage V6. Accordingly, the first switching element SWa and the second switching element SWb may be driven in the same manner.

As the amount of the movement of the object CAR in the input image increases, the display device 800 may increase at least one of the difference between the fifth voltage V5 and the second voltage V2 or the difference between the sixth voltage V6 and the fourth voltage. Accordingly, in response to the amount of the movement of the object CAR, luminance expression power in the display device may be increased.

Meanwhile, as the amount of the movement of the object CAR in the input image increases, the display apparatus 800 may increase the fifth voltage V5 or the sixth voltage V6. Accordingly, in response to the amount of the movement of the object CAR, luminance expression power in the display device may be increased.

Meanwhile, the display apparatus 800 may increase the application period of the fifth voltage V5 or the application period of the sixth voltage V6 as the amount of the movement of the object CAR in the input image increases. Accordingly, in response to the amount of the movement of the object CAR, luminance expression power in the display device may be increased.

FIG. 11A(a) shows an object CAR within an input image 1010, and FIG. 11A(b) illustrates a case in which an object CAR within an input image 1025 moves by Lb, which is larger than La.

FIG. 11B illustrates a method for driving the first switching element SWa within the first pixel PXLa of the first TFT panel TFTa in response to the input image of FIG. 11A.

First, as shown in FIG. 11B(a), while the first voltage V1 is applied to the first switching element SWa within the first pixel PXLa of the first TFT panel TFTa, the second voltage V2 higher than the first voltage V1 is applied to the first switching element SWa within the first pixel PXLa of the first TFT panel TFTa, at the time of Tm, in response to the object CAR within the image frame data.

Next, as shown in FIG. 11B(b), when the amount of the movement of the object CAR within the input image 1025 further increases compared to that of FIG. 10A, a seventh voltage V7 higher than the second voltage V2 and the fifth voltage V5, higher than the first voltage V1, is applied to the first switching element SWa within the first pixel PXLa of the first TFT panel TFTa, at the time of Tm, in response to the object CAR within the image frame data; and the second voltage V2 is applied again at the time of Tm2.

Accordingly, the transition period may be shortened further than that of FIG. 10B. Therefore, in response to the increase of the amount of the movement of the object CAR, luminance expression power in the display device 800 may be increased.

FIG. 11C illustrates a method for driving the second switching element SWb within the second pixel PXLb of the second TFT panel TFTb in response to the input image of FIG. 11A.

First, as shown in FIG. 11C(a), while the third voltage V3 is applied to the second switching element SWb within the second pixel PXLb of the second TFT panel TFTb, the fourth voltage V4 higher than the third voltage V3 is applied to the second switching element SWb within the second pixel PXLb of the second TFT panel TFTb, at the time of Tm, in response to the object CAR within the image frame data.

Next, as shown in FIG. 11C(b), an eighth voltage V8 higher than the fourth voltage V4 and the sixth voltage V6, higher than the third voltage V3, is applied to the second switching element SWb within the second pixel PXLb of the second TFT panel TFTb, at the time of Tm, in response to the object CAR within the image frame data; and the fourth voltage V4 is applied again at the time of Tm2.

Accordingly, the transition period may be shortened further than that of FIG. 10B. Therefore, in response to the increase of the amount of the movement of the object CAR, luminance expression power in the display device 800 may be increased.

Figure 11D:
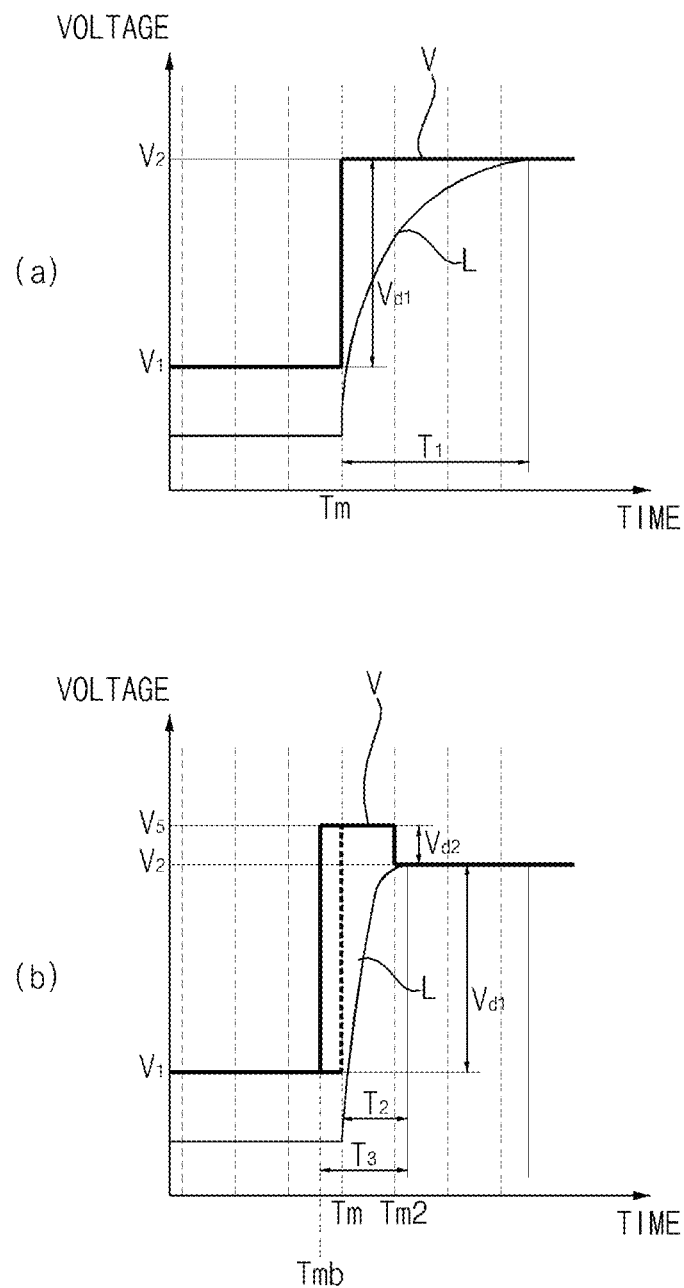

Meanwhile, although FIGS. 11B and 11C propose a method for increasing the magnitude of an over-driving voltage according to the amount of movement of an object to perform over-driving, the present disclosure is not limited to the specific method, and it is also possible to perform the over-driving in advance. Performing over-driving in advance will be described with reference to FIGS. 11D and 11E.

FIG. 11D illustrates another example of a method for driving the first switching element SWa within the first pixel PXLa of the first TFT panel TFTa in response to the input image of FIG. 11A.

First, as shown in FIG. 11D(a), while the first voltage V1 is applied to the first switching element SWa within the first pixel PXLa of the first TFT panel TFTa, the second voltage V2 higher than the first voltage V1 is applied to the first switching element SWa within the first pixel PXLa of the first TFT panel TFTa, at the time of Tm, in response to the object CAR within the image frame data.

Next, as shown in FIG. 11D(b), when the amount of the movement of the object CAR within the input image 1025 further increases compared to that of FIG. 10A, the seventh voltage V7 higher than the second voltage V2 and the fifth voltage V5, higher than the first voltage V1, is applied to the first switching element SWa within the first pixel PXLa of the first TFT panel TFTa, at the time of Tmb earlier than Tm, in response to the object CAR within the image frame data; and the second voltage V2 is applied again at the time of Tm2. In other words, the application period of the seventh voltage V7 may increase longer than that of FIG. 11B.

Accordingly, the transition period may be shortened further than that of FIG. 10B. Therefore, in response to the increase of the amount of the movement of the object CAR, luminance expression power in the display device 800 may be increased.

FIG. 11E illustrates another example of a method for driving the second switching element SWb within the second pixel PXLb of the second TFT panel TFTb in response to the input image of FIG. 11A.

First, as shown in FIG. 11E(a), while the third voltage V3 is applied to the second switching element SWb within the second pixel PXLb of the second TFT panel TFTb, the fourth voltage V4 higher than the third voltage V3 is applied to the second switching element SWb within the second pixel PXLb of the second TFT panel TFTb, at the time of Tm, in response to the object CAR within the image frame data.

Next, as shown in FIG. 11E(b), the eighth voltage V8 higher than the fourth voltage V4 and the sixth voltage V6, higher than the third voltage V3, is applied to the second switching element SWb within the second pixel PXLb of the second TFT panel TFTb, at the time of Tmb earlier than Tm, in response to the object CAR within the image frame data; and the fourth voltage V4 is applied again at the time of Tm2. In other words, the application period of the eighth voltage V8 may increase longer than that of FIG. 11C.

Accordingly, the transition period may be shortened further than that of FIG. 10B. Therefore, in response to the increase of the amount of the movement of the object CAR, luminance expression power in the display device 800 may be increased.

Meanwhile, although FIGS. 10A to 11E illustrate methods operating separately in the first TFT panel TFTa and the second TFT panel TFTb within the display device 100 when the signal processor 170 outputs one image frame data, the present disclosure is not limited to the specific methods, and various modifications thereof are allowed.

In other words, methods of FIGS. 10A to 11E may also be applied to the case in which the signal processor 170 outputs the first image frame data Imga and the second image frame data Imgb, respectively.

In other words, in the display device 800 according to an embodiment of the present disclosure, while the first voltage V1 is applied to the first switching element SWa within the first pixel PXLa of the first TFT panel TFTa, the second voltage V2 higher than the first voltage V1 is applied to the first switching element SWa within the first pixel PXLa of the first TFT panel TFTa in response to an object CAR within the first image frame data Imga input to the display device 800; while the third voltage V3 is applied to the second switching element SWb within the second pixel PXLb of the second TFT panel TFTb, the fourth voltage V4 higher than the third voltage V3 is applied to the second switching element SWb within the second pixel PXLb of the second TFT panel TFTb in response to an object CAR within the second image frame data Imgb input to the display device 800; and when the object CAR within the first image frame data Imga input to the display device 800 moves, the fifth voltage V5 higher than the second voltage V2 is applied to the first switching element SWa of the first TFT panel TFTa, and when the object CAR within the second image frame data Imgb input to the display device 800 moves, the sixth voltage V6 higher than the fourth voltage V4 is applied to the second switching element SWb within the second pixel PXLb of the second TFT panel TFTb. Accordingly, luminance expression power in the display device may be improved.

Meanwhile, when the object CAR within the first image frame data Imga input to the display device 800 moves, the fifth voltage V5 higher than the second voltage V2 is applied to the first switching element SWa of the first TFT panel TFTa, and the second voltage V2 is applied after the fifth voltage V5 is applied; when the object CAR within the second image frame data Imgb input to the display device 800 moves, the sixth voltage V6 higher than the fourth voltage V4 is applied to the second switching element SWb within the second pixel PXLb of the second TFT panel TFTb, and the fourth voltage V4 is applied after the sixth voltage V6 is applied. Accordingly, luminance expression power in the display device may be improved in response to the movement of the object CAR.

Meanwhile, as the amount of the movement of the object CAR in the first image frame data Imga increases, a difference between the fifth voltage V5 and the second voltage V2 increases; as the amount of the movement of the object CAR in the second image frame data Imgb increases, a difference between the sixth voltage V6 and the fourth voltage V4 increases. Accordingly, in response to the amount of the movement of the object CAR, luminance expression power in the display device may be increased.

Figure 12:
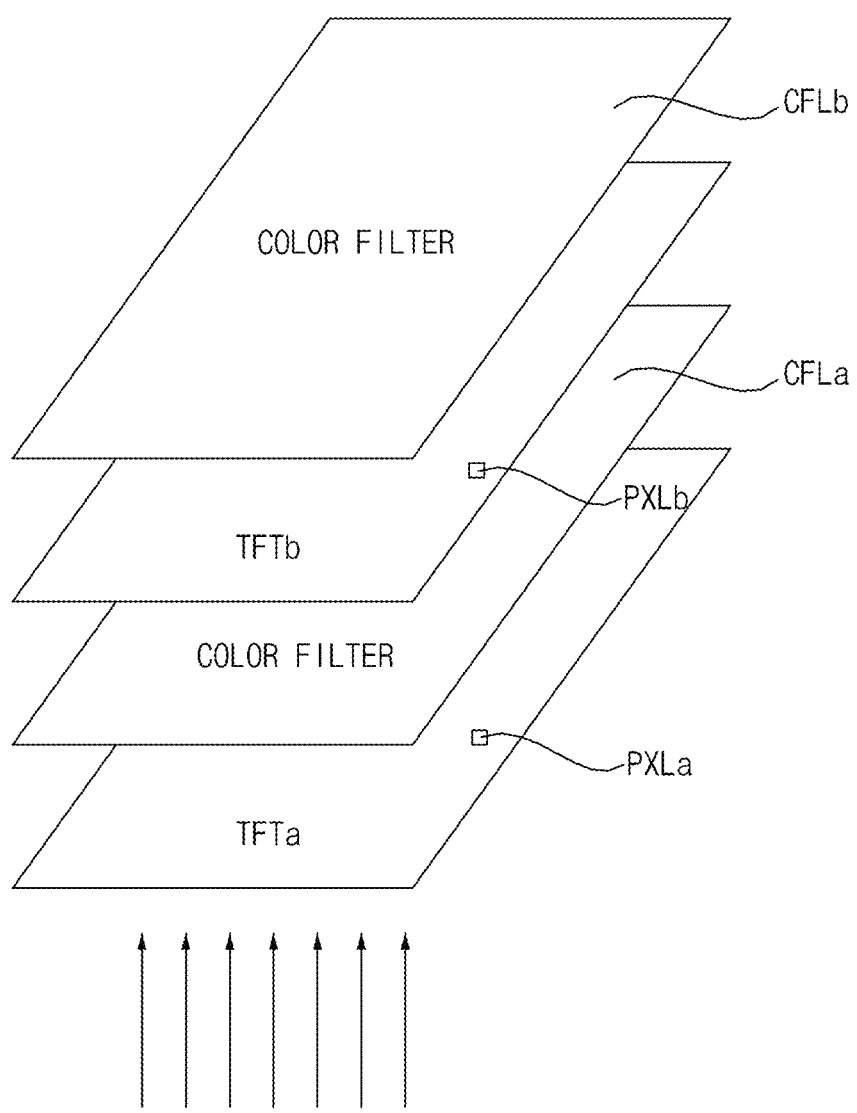
FIG. 12 is a simplified structure of a display device according to another embodiment of the present disclosure.

FIG. 12 is a simplified structure of a display device according to another embodiment of the present disclosure.

Referring to the figure, a display device 800 according to another embodiment of the present disclosure comprises a backlight 250, a first TFT panel TFTa having a plurality of switching elements and configured to control the amount of light penetration of the backlight 250 for the respective areas corresponding to the plurality of switching elements, a first color filter CFLa filtering the light output from the first TFT panel TFTa for each color, a second TFT panel TFTb having a plurality of switching elements and configured to control the amount of penetration of light output from the first color filter CFLa for the respective areas corresponding to the plurality of switching elements, and a second color filter CFLb filtering the light output from the second TFT panel TFTb for each color.

In particular, a difference exists in that, compared to the display device 800 of FIG. 7, the display device 800 of FIG. 12 further includes the second color filter CFLb.

In addition, descriptions of FIGS. 10A to 11E may be applied without modifications.

For example, when the signal processor 170 outputs one image frame data, the first TFT panel TFTa and the second TFT panel TFTb within the display device 800 may operate as illustrated in FIGS. 10A to 11E. Accordingly, luminance expression power may be increased, and color expression power may also be increased.

In other words, while the first voltage is applied to the first switching element SWa within the first pixel PXLa of the first TFT panel TFTa, the second voltage V2 higher than the first voltage V1 is applied to the first switching element SWa within the first pixel PXLa of the first TFT panel TFTa in response to an object CAR within the image frame data input to the display device 800; while the third voltage V3 is applied to the second switching element SWb within the second pixel PXLb of the second TFT panel TFTb, the fourth voltage V4 higher than the third voltage V3 is applied to the second switching element SWb within the second pixel PXLb of the second TFT panel TFTb in response to the object CAR within the image frame data input to the display device 800; and when the object CAR within the image frame data input to the display device 800 moves, the fifth voltage V5 higher than the second voltage V2 is applied to the first switching element SWa of the first TFT panel TFTa, and the sixth voltage V6 higher than the fourth voltage V4 is applied to the second switching element SWb within the second pixel PXLb of the second TFT panel TFTb. Accordingly, luminance expression power and color expression power in the display device may be improved.

Meanwhile, when the object CAR within the image frame data input to the display device 800 moves, the fifth voltage V5 higher than the second voltage V2 is applied to the first switching element SWa within the first pixel PXLa of the first TFT panel TFTa; after the fifth voltage V5 is applied, the second voltage V2 is applied; the sixth voltage V6 higher than the fourth voltage V4 is applied to the second switching element SWb within the second pixel PXLb of the second TFT panel TFTb; after the sixth voltage V6 is applied, the fourth voltage V4 is applied. Accordingly, in response to the movement of the object CAR, luminance expression power and color expression power in the display device may be improved.

Meanwhile, as the amount of the movement of the object CAR increases, at least one of difference between the fifth voltage V5 and the second voltage V2 or difference between the sixth voltage V6 and the fourth voltage V4 may increase. Accordingly, in response to the movement of the object CAR, luminance expression power and color expression power in the display device may be improved.

In another example, when the signal processor 170 outputs the first image frame data Imga and the second image frame data Imgb, respectively, as shown in FIGS. 10A to 11E, luminance expression power may be improved, and color expression power may also be improved.

In other words, while the first voltage is applied to the first switching element SWa within the first pixel PXLa of the first TFT panel TFTa, the second voltage V2 higher than the first voltage V1 is applied to the first switching element SWa within the first pixel PXLa of the first TFT panel TFTa in response to an object CAR within the image frame data input to the display device 800; while the third voltage V3 is applied to the second switching element SWb within the second pixel PXLb of the second TFT panel TFTb, the fourth voltage V4 higher than the third voltage V3 is applied to the second switching element SWb within the second pixel PXLb of the second TFT panel TFTb in response to the object CAR within the image frame data input to the display device 800; and when the object CAR within the first image frame data Imga input to the display device 800 moves, the fifth voltage V5 higher than the second voltage V2 is applied to the first switching element SWa of the first TFT panel TFTa, and when the object CAR within the second image frame data Imgb input to the display device 800 moves, the sixth voltage V6 higher than the fourth voltage V4 is applied to the second switching element SWb within the second pixel PXLb of the second TFT panel TFTb. Accordingly, luminance expression power and color expression power in the display device may be improved.

Meanwhile, the signal processor 170 may output the first image frame data Imga for driving the first TFT panel TFTa and the second image frame data Imgb for driving the second TFT panel TFTb; and control at least one of luminance and color of the first image frame data Imga and the second image frame data Imgb to be changed. Accordingly, at least one of luminance expression power and color expression power in the display device may be improved.

Meanwhile, the signal processor 170 may control to perform at least one of adaptive adjustment of dynamic range, adaptive adjustment of contrast, adaptive adjustment of color, and adaptive adjustment of over-drive based on the movement or depth of the object CAR of the first image frame data Imga and the second image frame data Imgb. Accordingly, at least one of dynamic range expression power, contrast expression power, color expression power, and over-drive expression power may be improved.

While the present disclosure has been particularly shown and described with reference to exemplary embodiments thereof, it is clearly understood that the present disclosure is not limited to the specific embodiment described above, and various modifications are available to those ordinary skilled in the art without departing from the subject matter claimed in the accompanying claims. Further, the various modifications should not be individually understood from the technical concept or prospect of the present disclosure.

INDUSTRIAL APPLICABILITY

The present disclosure may be applied to a display device and an image display apparatus including the same.

What is claimed is:

1. A display device comprising:
   a backlight;
   a first TFT panel including a plurality of switching elements and configured to control the amount of light penetration of the backlight for the respective areas corresponding to the plurality of switching elements;
   a second TFT panel including a plurality of switching elements and configured to control the amount of penetration of light output from the first TFT panel for the respective areas corresponding to the plurality of switching elements; and
   a color filter to filter the light output from the second TFT panel for each color,
   wherein, while a first voltage is applied to a first switching element of the first TFT panel, a second voltage higher than the first voltage is applied to the first switching element of the first TFT panel in response to an object within an image frame data input to the display device;
   while a third voltage is applied to a second switching element of the second TFT panel, a fourth voltage higher than the third voltage is applied to the second switching element of the second TFT panel in response to the object within the image frame data input to the display device; and
   in response to movement of the object within the image frame data input to the display device, a fifth voltage higher than the second voltage is applied to the first switching element of the first TFT panel, and a sixth voltage higher than the fourth voltage is applied to the second switching element of the second TFT panel.

2. The display device of claim 1, wherein, in response to movement of the object within the image frame data input to the display device, the fifth voltage higher than the second voltage is applied to the first switching element of the first TFT panel, and the second voltage is applied after the fifth voltage is applied;
   the sixth voltage higher than the fourth voltage is applied to the second switching element of the second TFT panel, and the fourth voltage is applied after the sixth voltage is applied.

3. The display device of claim 1, wherein, as the amount of the movement of the object increases, at least one of difference between the fifth voltage and the second voltage or difference between the sixth voltage and the fourth voltage increases.

4. The display device of claim 1, wherein, as the amount of the movement of the object increases, the fifth voltage increases, or the sixth voltage increases.

5. The display device of claim 1, wherein, as the amount of the movement of the object increases, an application period of the fifth voltage increases, or an application period of the sixth voltage increases.

6. The display device of claim 1, wherein, the third voltage is higher than the fourth voltage.

7. The display device of claim 1, wherein, in the case of a dynamic range mode, the second voltage is different from the fourth voltage, and the fifth voltage is different from the sixth voltage.

8. The display device of claim 1, wherein, in the case of not being in the dynamic range mode, the second voltage is the same as the fourth voltage, and the fifth voltage is the same as the sixth voltage.

9. A display device comprising:

a backlight;

a first TFT panel including a plurality of switching elements and configured to control the amount of light penetration of the backlight for the respective areas corresponding to the plurality of switching elements;

a second TFT panel including a plurality of switching elements and configured to control the amount of penetration of light output from the first TFT panel for the respective areas corresponding to the plurality of switching elements; and a color filter to filter the light output from the second TFT panel for each color, wherein, while a first voltage is applied to a first switching element of the first TFT panel, a second voltage higher than the first voltage is applied to the first switching element of the first TFT panel in response to an object within a first image frame data input to the display device;

while a third voltage is applied to a second switching element of the second TFT panel, a fourth voltage higher than the third voltage is applied to the second switching element of the second TFT panel in response to an object within a second image frame data input to the display device; and in response to movement of the object within the first image frame data input to the display device, a fifth voltage higher than the second voltage is applied to the first switching element of the first TFT panel, and in response to movement of the object within the second image frame data input to the display device, a sixth voltage higher than the fourth voltage is applied to the second switching element of the second TFT panel.

10. The display device of claim 9, wherein, in response to movement of the object within the first image frame data input to the display device, the fifth voltage higher than the second voltage is applied to the first switching element of the first TFT panel, and the second voltage is applied after the fifth voltage is applied;

in response to movement of the object within the second image frame data input to the display device, the sixth voltage higher than the fourth voltage is applied to the second switching element of the second TFT panel, and the fourth voltage is applied after the sixth voltage is applied.

11. The display device of claim 9, wherein, as the amount of the movement of the object within the first image frame data increases, difference between the fifth voltage and the second voltage increases, and as the amount of the movement of the object within the second image frame data increases, difference between the sixth voltage and the fourth voltage increases.

12. A display device comprising:

a backlight;

a first TFT panel including a plurality of switching elements and configured to control the amount of light penetration of the backlight for the respective areas corresponding to the plurality of switching elements;

a first color filter to filter the light output from the first TFT panel for each color;

a second TFT panel including a plurality of switching elements and configured to control the amount of penetration of light output from the first color filter for the respective areas corresponding to the plurality of switching elements; and a second color filter to filter the light output from the second TFT panel for each color, wherein, while a first voltage is applied to a first switching element of the first TFT panel, a second voltage higher than the first voltage is applied to the first switching element of the first TFT panel in response to an object within an image frame data input to the display device;

while a third voltage is applied to a second switching element of the second TFT panel, a fourth voltage higher than the third voltage is applied to the second switching element of the second TFT panel in response to the object within the image frame data input to the display device; and in response to movement of the object within the image frame data input to the display device, a fifth voltage higher than the second voltage is applied to the first switching element of the first TFT panel, and a sixth voltage higher than the fourth voltage is applied to the second switching element of the second TFT panel.

13. The display device of claim 12, wherein, in response to movement of the object within the image frame data input to the display device, the fifth voltage higher than the second voltage is applied to the first switching element of the first TFT panel, and the second voltage is applied after the fifth voltage is applied;

the sixth voltage higher than the fourth voltage is applied to the second switching element of the second TFT panel, and the fourth voltage is applied after the sixth voltage is applied.

14. The display device of claim 12, wherein, as the amount of the movement of the object increases, at least one of difference between the fifth voltage and the second voltage or difference between the sixth voltage and the fourth voltage increases.

15. A display device comprising:

a backlight;

a first TFT panel including a plurality of switching elements and configured to control the amount of light penetration of the backlight for the respective areas corresponding to the plurality of switching elements;

a first color filter to filter the light output from the first TFT panel for each color;

a second TFT panel including a plurality of switching elements and configured to control the amount of penetration of light output from the first color filter for the respective areas corresponding to the plurality of switching elements; and a second color filter to filter the light output from the second TFT panel for each color, wherein, while a first voltage is applied to a first switching element of the first TFT panel, a second voltage higher than the first voltage is applied to the first switching element of the first TFT panel in response to an object within a first image frame data input to the display device;

while a third voltage is applied to a second switching element of the second TFT panel, a fourth voltage higher than the third voltage is applied to the second switching element of the second TFT panel in response to an object within a second image frame data input to the display device; and in response to movement of the object within the first image frame data input to the display device, a fifth voltage higher than the second voltage is applied to the first switching element of the first TFT panel, and in response to movement of the object within the second image frame data input to the display device, a sixth voltage higher than the fourth voltage is applied to the second switching element of the second TFT panel.

16. An image display apparatus comprising:

a display device; and a signal processor configured to output an image frame data to the display device, wherein the display device comprising:

a backlight;

a first TFT panel including a plurality of switching elements and configured to control the amount of light penetration of the backlight for the respective areas corresponding to the plurality of switching elements;

a second TFT panel including a plurality of switching elements and configured to control the amount of penetration of light output from the first TFT panel for the respective areas corresponding to the plurality of switching elements; and a color filter to filter the light output from the second TFT panel for each color, wherein, while a first voltage is applied to a first switching element of the first TFT panel, a second voltage higher than the first voltage is applied to the first switching element of the first TFT panel in response to an object within an image frame data input to the display device;

while a third voltage is applied to a second switching element of the second TFT panel, a fourth voltage higher than the third voltage is applied to the second switching element of the second TFT panel in response to the object within the image frame data input to the display device; and in response to movement of the object within the image frame data input to the display device, a fifth voltage higher than the second voltage is applied to the first switching element of the first TFT panel, and a sixth voltage higher than the fourth voltage is applied to the second switching element of the second TFT panel.

17. The image display device of claim 16, wherein the signal processor is configured to output a first image frame data for driving the first TFT panel and a second image frame data for driving the second TFT panel; and change at least one of luminance and color of the first image frame data or the second image frame data.

18. The image display device of claim 17, wherein the signal processor is configured to perform at least one of dynamic range adjustment, contrast adjustment, color adjustment, or overdrive adjustment based on the movement or depth of an object of the first image frame data and the second image frame data.

19. The image display device of claim 16, wherein, in response to movement of the object within the image frame data input to the display device, the fifth voltage higher than the second voltage is applied to the first switching element of the first TFT panel, and the second voltage is applied after the fifth voltage is applied;

the sixth voltage higher than the fourth voltage is applied to the second switching element of the second TFT panel, and the fourth voltage is applied after the sixth voltage is applied.

20. The image display device of claim 16, wherein, as the amount of the movement of the object increases, at least one of difference between the fifth voltage and the second voltage or difference between the sixth voltage and the fourth voltage increases.

* * * * *